(12) United States Patent
Kanekawa et al.

(10) Patent No.: US 7,009,535 B2
(45) Date of Patent: Mar. 7, 2006

(54) RESOLVER/DIGITAL CONVERTER AND CONTROL APPARATUS USING THE SAME

(75) Inventors: Nobuyasu Kanekawa, Hitachi (JP); Shoji Sasaki, Hitachinaka (JP); Katsuya Oyama, Hitachinaka (JP); Tomonobu Koseki, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/211,506

(22) Filed: Aug. 26, 2005

(65) Prior Publication Data

US 2005/0280570 A1     Dec. 22, 2005

Related U.S. Application Data

(62) Division of application No. 11/043,639, filed on Jan. 27, 2005.

(30) Foreign Application Priority Data

| Jan. 28, 2004 | (JP) | ............................. 2004-020368 |
| Apr. 1, 2004 | (JP) | ............................. 2004-108614 |
| Dec. 3, 2004 | (JP) | ............................. 2004-350551 |

(51) Int. Cl.
*H03M 1/48*   (2006.01)
*G06F 11/30*  (2006.01)

(52) U.S. Cl. ..................... 341/116; 702/183; 700/83; 700/86

(58) Field of Classification Search ............... 341/116; 700/83; 702/183
See application file for complete search history.

(56) References Cited

U.S. PATENT DOCUMENTS

| 4,134,106 | A | * | 1/1979 | Hungerford | ................. 341/116 |
| 4,651,130 | A | * | 3/1987 | Pennell | ....................... 341/116 |
| 5,015,934 | A | | 5/1991 | Holley et al. | |
| 5,229,697 | A | * | 7/1993 | Taylor et al. | ................ 318/563 |
| 5,347,277 | A | | 9/1994 | Nondahl et al. | |
| 6,157,864 | A | * | 12/2000 | Schwenke et al. | ............ 700/83 |
| 6,278,388 | B1 | * | 8/2001 | Kushihara | ................... 341/112 |
| 6,389,373 | B1 | * | 5/2002 | Ohya | ........................ 702/189 |
| 6,552,666 | B1 | * | 4/2003 | Goto et al. | ................. 318/652 |
| 6,556,950 | B1 | * | 4/2003 | Schwenke et al. | .......... 702/183 |
| 6,583,738 | B1 | * | 6/2003 | Ito | .............................. 341/116 |
| 6,618,856 | B1 | * | 9/2003 | Coburn et al. | ................ 700/86 |

(Continued)

FOREIGN PATENT DOCUMENTS

JP     09-072758     3/1997

(Continued)

OTHER PUBLICATIONS

Catalog of Smartcoder AU6802, Tamagawa Seiki Co., T12-159N1 (Apr. 20, 2002).

*Primary Examiner*—Don Le
*Assistant Examiner*—Lam T. Mai
(74) *Attorney, Agent, or Firm*—Crowell & Moring LLP

(57) ABSTRACT

This resolver/digital converter has a resolver, a resolver/digital converting portion and an exciting signal generator. The exciting signal generated from the exciting signal generator is supplied to the resolver, and the resolver signals produced from the resolver are supplied to the resolver/digital converter. This resolver/digital converter further has a conversion trigger generator that generates a conversion trigger signal on the basis of the exciting signal generated from the exciting signal generator, an A/D converter that converts the resolver signals produced from the resolver to digital values in response to the conversion trigger signal generated from the conversion trigger generator, and computing means that detects the failure status on the basis of the digital values produced from the A/D converter.

12 Claims, 20 Drawing Sheets

U.S. PATENT DOCUMENTS

| | | | |
|---|---|---|---|
| 6,862,553 B1 * | 3/2005 | Schwenke et al. | ............ 700/83 |
| 6,885,310 B1 * | 4/2005 | Goto et al. | ............ 340/870.31 |
| 6,891,492 B1 * | 5/2005 | Kushihara | ................... 341/155 |
| 2001/0054911 A1 | 12/2001 | Kobayasi et al. | |
| 2002/0175645 A1 | 11/2002 | Fujimoto et al. | |
| 2003/0107339 A1 | 6/2003 | Shimizu et al. | |

FOREIGN PATENT DOCUMENTS

| | | | | |
|---|---|---|---|---|
| JP | 09-280890 | | 10/1997 | |
| JP | 2005-114442 | * | 4/2005 | ................. 341/116 |

* cited by examiner

FIG. 25

| PART | FAILURE TO BE DETECTED | DETECTING MEANS | |
|---|---|---|---|
| | | RESOLVER/DIGITAL CONVERTING PORTION 2 | ERROR DETECTING FUNCTION 12 |
| RESOLVER/ DIGITAL CONVERT- ING PORTION 2 | FAILURE (1) DUE TO ABNORMALITY OF WAVEFORM OF SIGNAL FROM OR TO RESOLVER WHEN SIGNAL IS DISCONNECTED | ◯ | ◯ |
| | FAILURE (2) OF FUNCTION FOR DETECTING FAILURE (1) AND NOTIFYING MICROCOMPUTER | | ◯ |
| | FAILURE (3) OF RESOLVER/DIGITAL CONVERTING FUNCTION ITSELF FOR PERFORMING PROCESS TO FIND θ ACCORDING TO SIGNAL FROM RESOLVER | ◯ | ◯ |
| | FAILURE (4) OF FUNCTION FOR DETECTING FAILURE (3) AND NOTIFYING MICROCOMPUTER | | ◯ |
| ERROR DETECTING FUNCTION 12 | FAILURE (1) DUE TO ABNORMALITY OF WAVEFORMS OF SIGNAL FROM OR TO RESOLVER WHEN SIGNAL IS DISCONNECTED | ◯ | |
| | FAILURE (2) OF FUNCTION FOR DETECTING FAILURE (1) AND NOTIFYING MICROCOMPUTER | ◯ | |
| | FAILURE (3) OF RESOLVER/DIGITAL CONVERTING FUNCTION ITSELF FOR PERFORMING PROCESS TO FIND θ ACCORDING TO SIGNAL FROM RESOLVER | ◯ | |
| | FAILURE (4) OF FUNCTION FOR DETECTING FAILURE (3) AND NOTIFYING MICROCOMPUTER | ◯ | |

FIG. 26

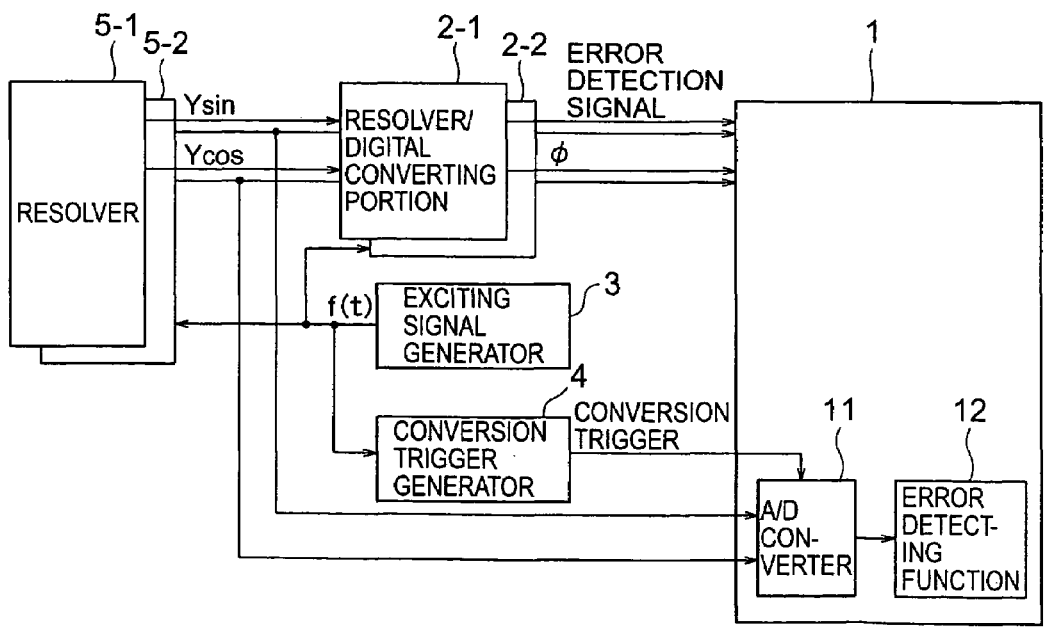

FIG. 31

| Case | DIGNOSIS RESULT (111-i) OF INTEREST ||| DIGNOSIS RESULT (111-j) OF OTHER ||| ON/OFF (410-i) |
|---|---|---|---|---|---|---|---|
| | MINOR | MIDDLE | SERIOUS | MINOR | MIDDLE | SERIOUS | |
| 1 | NO | NO | NO | * | * | * | ON |
| 2 | YES | NO | NO | YES | NO | NO | ON |
| 3 | YES | NO | NO | NO | NO | NO | OFF |
| 4 | YES | YES | NO | * | YES | NO | ON |
| 5 | YES | YES | NO | * | NO | NO | OFF |
| 6 | YES | YES | YES | * | * | * | OFF |

IF (FAILURE GRADE OF INTEREST) > (FAILURE GRADE OF OTHER), THEN ON/OFF SIGNAL OF INTEREST IS TURED OFF, OR IF NOT, THEN ON/OFF SIGNAL OF INTEREST IS TURNED ON

FIG. 32

| PART | MINOR FAILURE | MIDDLE FAILURE | SERIOUS FAILURE |
|---|---|---|---|
| SENSOR | SENSOR RESOLUTION SLIGHTLY REDUCED, ERROR INCREASED | SENSOR RESOLUTION MODERATELY REDUCED, ERROR INCREASED | ABNORMAL SENSOR SIGNAL (OUTPUT SHORTED TO POWER SOURCE OR TO GROUND, OUTPUT FIXED, RATIONALITY BROKEN) |
| MEMORY | 1-BIT ERROR (CORRECTABLE BY ECC) | 1-BIT ERROR FREQUENTLY OCCURS (NOT CORRECTABLE BY ECC) | MULTI-BIT ERROR (NOT CORRECTABLE BY ECC) |
| PROCESSOR | MISMATCHED COMPUTATION RESULTS OF OCCURRENCE FREQUENCY OF THRESHOLD OR BELOW | MISMATCHED COMPUTATION RESULTS OF OCCURRENCE FREQUENCY OF THRESHOLD OR ABOVE | WATCH DOG TIMER, TIME OUT, PROCESS RESULTS MISMATCHED, INCORRECT EXAMPLE COMPUTATION RESULT |

RESOLVER/DIGITAL CONVERTER AND CONTROL APPARATUS USING THE SAME

This application is a divisional of U.S. patent application Ser. No. 11/043,639, filed Jan. 27, 2005.

BACKGROUND OF THE INVENTION

The present invention relates to a resolver/digital converter, and particularly to a resolver/digital converter having a failure detecting function or to the failure detecting function of the resolver/digital converter.

The servo control system needs a rotation-angle sensor in order to detect the rotation angle and make the feedback control. The brushless motor control also requires the rotation-angle sensor in order to cause current to flow in the coil of the motor in accordance with the rotation angle of the motor as well as the servo control system does. The resolver has so far been widely used as a rotation-angle sensor since it is rigid and resistant to the environment because of its simple structure.

In addition, the servo control system that is used for motor-driven power steering, or x-by-wire control system, particularly steer-by-wire or fly-by-wire control system is required to have a failure detecting function because it needs safety and reliability.

Moreover, a resolver/digital converter has been developed for converting the signal from the resolver to a rotation angle and supplying it as digital data to a microcomputer or the like (see the catalog of Smartcoder AU6802, Tamagawa Seiki Co., T12-159N1 (Apr. 20, 2002), http://www.tamagawa-seiki.co.jp/ctl/1591n3j.pdf (nonpatent literature 1)). The resolver/digital converter according to this document forms a feedback loop that the estimate $\phi$ of a rotation angle is modified by the residual error $\epsilon$ resulting from the computation of $\sin(\phi)$, $\cos(\phi)$ generated from the estimate $\phi$ of rotation angle and the input signal, thereby making the estimate $\phi$ of rotation angle be converged to the actual rotation angle $\theta$. This system also has the function to notify the microcomputer of the occurrence of a failure when the residual error $\epsilon$ exceeds a certain value.

In addition, according to JP-A-9-280890 (patent document 1), the failure of the resolver is detected by using the property of trigonometric function that $\sin^2(\theta)+\cos^2(\theta)=1$ as the output from the resolver.

Furthermore, according to JP-A-9-72758 (patent document 2), an abnormality-detecting signal processor for finding the angle $\theta$ is provided independently of an angle-detecting signal processor, and the failure is detected from the difference between the angles $\theta$ produced from both processors.

SUMMARY OF THE INVENTION

According to the prior art described in the nonpatent document 1, if the signal from or to the resolver is disconnected, the signal from the resolver becomes abnormal, and thus it does not satisfy the relation between $\sin(\theta)$ and $\cos(\theta)$ that is the condition of the feedback loop convergence. As a result, the residual error $\epsilon$ becomes large, thus this fact being sent to the microcomputer as a failure. Also, if the feedback loop for finding the estimate $\phi$ of rotation angle does not work, the residual error $\epsilon$ does not converge, but diverges, thus this fact being sent to the microcomputer as a failure. In this case, if the function for judging that the residual error $\epsilon$ exceeds a certain value and the function to notify the microcomputer of the failure break down (fixed failure of the output, open or short circuit failure), the event of this failure occurrence cannot be transmitted to the microcomputer. Thus, this fact must be further considered.

According to the prior art described in the patent document 1, if the signal from or to the resolver is disconnected, the signal from the resolver becomes abnormal, and thus it does not satisfy the relation between $\sin(\theta)$ and $\cos(\theta)$. Thus, since the value of $\sin^2(\theta)+\cos^2(\theta)$ is deviated from 1, a failure is detected, and hence the microcomputer can be informed of the failure. However, the failure that can be detected in this system is only the failure of the abnormal signal waveform due to the disconnection of the signal from or to the resolver. That is, if a failure occurs in the resolver/digital converter function itself that performs the process for finding the angle $\theta$, this failure cannot be detected.

Moreover, according to the method in patent document 2, since both angles $\theta$ redundantly found are compared, it is possible that, even if a failure (3) occurs in the resolver/digital converter function, and if another failure occurs in the function to notify the microcomputer of the failure (3), the failure (3) and this other failure can be both detected.

Therefore, the kinds of failure that can be detected by the microcomputer with the techniques mentioned in the above documents combined are as follows.

(1) Failure of abnormality of signal waveform caused when the signal from or to the resolver is disconnected.
(2) Failure in the function to detect failure (1) and notify the microcomputer of it.
(3) Failure in the resolver/digital converter function itself that performs the process for finding $\theta$ on the basis of signal from the resolver.
(4) Failure in the function to detect the failure (3) and notify the microcomputer of it.

However, the method in patent document 2 still needs consideration about the following points.

(i) Simplicity in Computation

The computation load is large in finding $\theta$ from values of trigonometric functions (sin, cos), and judgment to be made over the boundary between the regions of $\theta$ is required to reconsider. For example, when one $\theta$ is 1°, the other 359°, the difference between both angles must be judged to be 2°.

(ii) Design Diversity

The processes for redundantly finding $\theta$ are extremely similar since both values of $\theta$ are found from sin and cos component signals. Thus, these processes are easy to cause error in the design common to both, and accompany a systematic error. Particularly for the application in which safety is emphasized, the idea of design diversity and n-version design is desired to introduce.

Accordingly, it is the first objective of the invention to provide a method capable of detecting the above failures (1) through (4), and having (i) simplicity in computation and (ii) design diversity.

The electrical failure mode of the resolver can be roughly divided into disconnection of windings, and short circuit of windings. The short circuit of windings can be further divided into a short circuit between lines of the same winding and a short circuit between lines of different windings (inter-phase short circuit). The disconnection of windings and the short circuit between lines of the same winding can be detected by a method of examining a Lissajous figure of signals described in, for example, the patent document 1.

When the single-end input means is used, the inter-phase short circuit can be detected by the method of examining the Lissajous figure of signals described in the patent document 1, but the operation is immediately affected by the short circuit. When the differential input means is used, the operation is not immediately affected, but the inter-phase short circuit cannot be detected by the method of examining the Lissajous figure of signals described in the patent document 1.

Thus, it is the second objective of the invention to provide a method of immediately detecting the occurrence of an inter-phase short circuit with the operation immediately not affected by the inter-phase short.

In addition, when considering the application of the invention to the motor-driven power steering of large-size vehicles and steer-by-wire system, the driving operation cannot be stopped immediately when a failure occurs, but it is required to continue, or the so-called fault tolerance technology is necessary. Simply providing two or more subsystems having a fail silent function to immediately stop the driving operation at the time of failure will enable the operation to continue at the time of failure. However, in a system in which two subsystems having the fail silent function are provided, if both subsystems are broken down, they stop operating with the result that the whole system cannot continue the operation.

Accordingly, it is the third objective of the invention to provide a fault tolerance system that can maintain the operation of the whole system even if both subsystems break down together.

In order to achieve the first objective of the invention, according to the invention, the signals from the resolver are received by a plurality of redundant input circuits, an angle θ is estimated from the signal received by one input circuit, and the value of a trigonometric function corresponding to this angle is computed and compared with the value of the signal received by the other input circuit, thereby detecting a failure.

Comparing the trigonometric functions as mentioned above will need no contrivance to make judgment over the regions as described above. The computation of trigonometric functions of θ can be usually made by using a conversion table that is previously provided to materialize an application, and thus the load on the computation can be reduced.

In order to achieve the second objective of the invention, according to the invention, the signals from the resolver are received in a differential manner by one input circuit of the redundantly provided input circuits, and the signals from the resolver are received in a single-end manner by the other input circuit.

The receiving of the signals from the resolver by one input circuit in a differential manner as mentioned above will enable the operation to continue without being affected by the inter-phase short circuit. In addition, the receiving of the signals from the resolver by the other input circuit in a single-end manner will enable the occurrence of inter-phase short circuit to be detected by using a method of examining the Lissajous figure of signals described in the patent document 1.

In order to achieve the third objective of the invention, according to the invention, a system is provided to have a plurality of fail-silent subsystems each of which stops the operation of the actuator when a failure is detected by a failure detecting function, and the following function is also provided. That is, when the failure in one subsystem, or the subsystem of interest, is serious as compared with that in the other subsystem, the actuator of the subsystem of interest is stopped in operation, but when the failure in the subsystem of interest is minor as compared with that in the other subsystem, the actuator of the subsystem of interest is not stopped in operation.

As described above, by providing the function to judge whether the operation of the actuator of the subsystem of interest is stopped according to the degree of failure, or minor or serious failure, it is possible to continue the operation of the subsystem having a minor failure when failures occur in a plurality of subsystems.

According to one embodiment of the invention, it is possible to provide a resolver/digital converter capable of detecting failures with simple computation.

According to another embodiment of the invention, it is possible to provide a resolver/digital converter that, when an inter-phase short circuit occurs, cannot be affected immediately by the failure but can detect immediately the failure.

According to still another embodiment of the invention, it is possible to provide a fault tolerant system capable of continuing the operation of the whole system even if failures occur in both subsystems.

Other objects, features and advantages of the invention will become apparent from the following description of the embodiments of the invention taken in conjunction with the accompanying drawings.

BRIEF DESCRIPTION OF THE DRAWINGS

FIG. 25 is a table of failures that can be detected by this invention.

FIG. 26 is a block diagram showing an embodiment of a fault tolerant resolver and fault resolver/digital converter according to the invention in which each of the fault tolerant resolver and resolver/digital converter is doubled to be fault tolerant.

FIG. 31 is a table showing an example of the judgment in the reliability-order judging portion.

FIG. 32 is a table showing an example of the classification of failures into minor, middle and serious defects.

DESCRIPTION OF THE EMBODIMENTS

Embodiments of the invention will be described with reference to the accompanying drawings.

Figure 1:
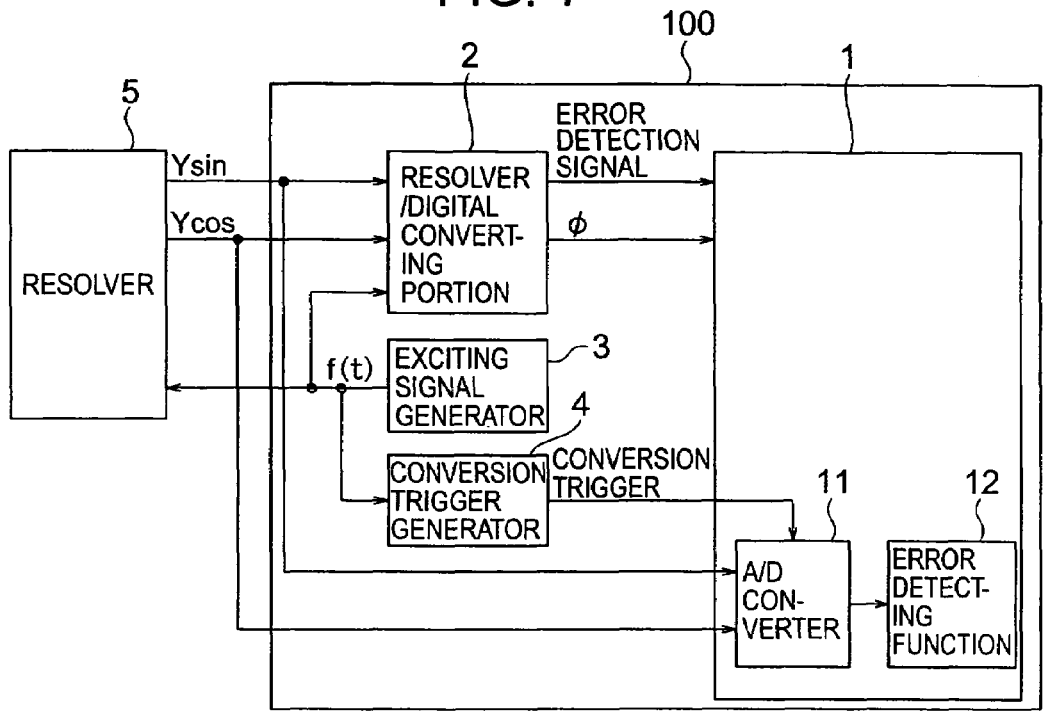
FIG. 1 is a block diagram showing a basic embodiment of the invention.

FIG. 1 is a block diagram of a basic embodiment of a controller 100 having a failure detecting function for detecting the failure in the resolver circuits.

An exciting current f(t) generated from an exciting signal generator 3 is supplied to a resolver 5. The exciting signal f(t) is generally often assigned a trigonometric function such as $A \cdot \sin(\omega t)$, where A is the amplitude, and $\omega$ is the angular velocity that is expressed by $\omega = 2\pi f$ of which f is frequency. The resolver 5 produces resolver signals $Y_{sin}$ and $Y_{cos}$. The resolver signals $Y_{sin}$ and $Y_{cos}$, respectively, can be expressed by $$Y_{sin} = k \cdot \sin(\theta) \cdot f(t)$$

$$Y_{cos} = k \cdot \cos(\theta) \cdot f(t)$$

where $\theta$ is the rotation angle, and k is the gain. A resolver/digital converting portion 2 produces an estimated angle $\phi$ on the basis of the resolver signals $Y_{sin}$ and $Y_{cos}$. The resolver/digital converting-portion 2 also produces an error detection signal and supplies it together with the estimated angle $\phi$ to a microcomputer 1. The resolver/digital converting portion 2 can be constructed differently, and the typical one can be considered to use the method proposed in the nonpatent document 1. The resolver/digital converting portion 2 described in the nonpatent document 1 is the unitary body formed of the resolver/digital converting portion 2 and exciting signal generator 3 built in the same chip.

Although the above-given resolver/digital converting portion and exciting signal generator are the same as in the prior art, an embodiment of the invention further uses a conversion trigger generator 4 to generate a conversion trigger on the basis of the exciting signal f(t), an A/D converter 11 to convert the resolver signals $Y_{sin}$ and $Y_{cos}$ to digital signals by using the conversion trigger, and an error detecting function 12 to detect error due to a failure.

Figure 2:
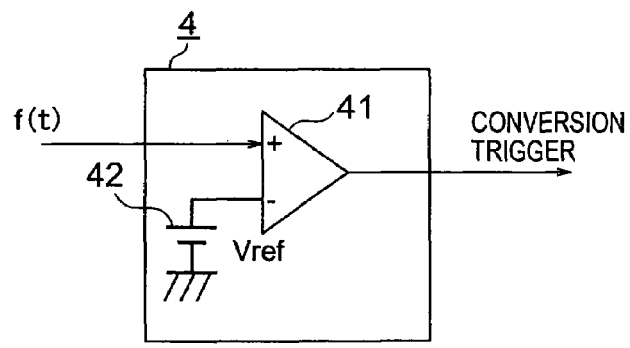
FIG. 2 is a block diagram showing an embodiment of the invention in which a conversion trigger generator is used as a voltage comparator.

The conversion trigger generator 4 can also be constructed differently. FIG. 2 shows an example of the conversion trigger generator 4 in which a voltage comparator 41 is used to compare the exciting signal f(t) and a reference voltage ($V_{ref}$) 42. In this embodiment, since the resolver signals $Y_{sin}$ and $Y_{cos}$ are converted to digital signals when the exciting signal f(t) reaches $V_{ref}$, the resolver signals $Y_{sin}$ and $Y_{cos}$, when $f(t)=V_{ref}$, or at the time of digital conversion, are respectively given by $$Y_{sin} = k \cdot \sin(\theta) \cdot V_{ref}$$

$$Y_{cos} = k \cdot \cos(\theta) \cdot V_{ref}$$

Figure 3:
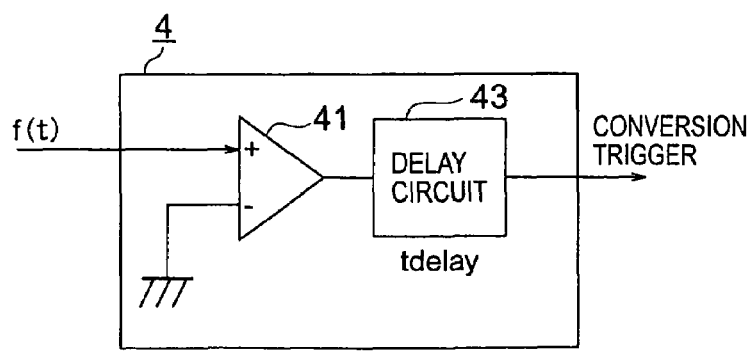
FIG. 3 is a block diagram showing an embodiment of the invention in which the conversion trigger generator is used as a zero cross detector and delay circuit.

FIG. 3 shows another example of the conversion trigger generator 4 in which the voltage comparator 41 is used to compare the exciting signal f(t) and 0 volt and detect zero cross points, and a delay circuit 43 is used to delay it by $t_{delay}$. If the exciting signal satisfies $f(t)=A \cdot \sin(\omega t_{delay})$, the resolver signals $Y_{sin}$ and $Y_{cos}$ at the time of digital conversion are respectively expressed by $$Y_{sin} = k \cdot \sin(\theta) \cdot A \cdot \sin(\omega t_{delay})$$

$$Y_{cos} = k \cdot \cos(\theta) \cdot A \cdot \sin(\omega t_{delay})$$

Thus, $\sin(\theta)$, $\cos(\theta)$ and $\tan(\theta)$ can be found in the same way as those in the example of FIG. 2. If the differences between those values and $\sin(\phi)$, $\cos(\phi)$ and $\tan(\phi)$ based on the estimate $\phi$ of angle are within allowable ranges, the result is normal. If they are out of the ranges, the result can be judged to be a failure. In order for the resolver signals $Y_{sin}$ and $Y_{cos}$ to be maximized to improve the S/N ratio, it is preferable to satisfy $\omega_{delay} = \pi/2$, or $t_{delay} = \pi/2\omega$. In this embodiment, the delay circuit 43 for delaying by $t_{delay}$ can be constructed by a timer provided within the microprocessor, and thus the number of discrete components to be used can be greatly reduced.

Figure 4:
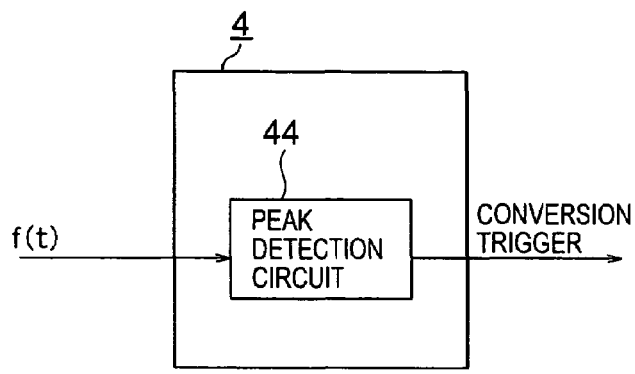
FIG. 4 is a block diagram showing an embodiment of the invention in which the conversion trigger generator is used as a peak detector.

FIG. 4 shows another example of the conversion trigger generator 4 as a peak detector 44. The peak detector 44 can be achieved by a method for differentiating the exciting signal f(t) and finding the time when it becomes zero, a method for using a phase shifter to delay the exciting signal f(t) by 90 degrees so that the zero cross can be obtained, or a method for holding peaks in turn while they are being updated, and finding as a time of peak the time when the current value becomes below the held peak value.

According to this embodiment, the resolver signals $Y_{sin}$ and $Y_{cos}$ at the time of conversion are respectively given by $$Y_{sin} = k \cdot \sin(\theta) \cdot A$$

$$Y_{cos} = k \cos(\theta) \cdot A$$

The values of $\sin(\phi)$, $\cos(\phi)$ and $\tan(\phi)$ are found in the same way as those in the embodiments shown in FIGS. 2 and 3. If the differences of those values to the values of $\sin(\phi)$, $\cos(\phi)$ and $\tan(\phi)$ are within the allowable ranges, the result is regarded as normal. If the differences are out of the allowable ranges, the result can be judged to be a failure.

Figure 5:
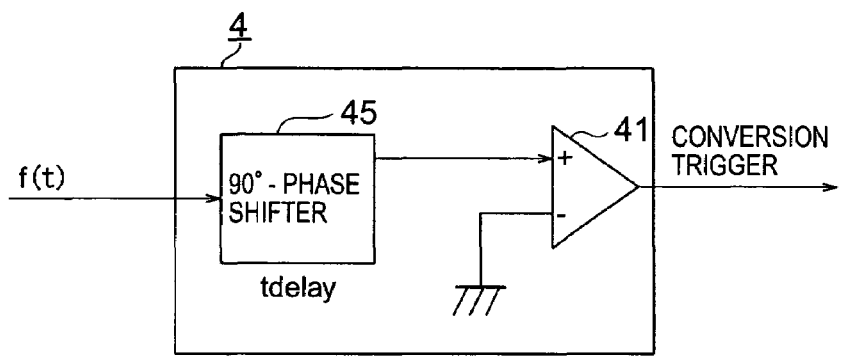
FIG. 5 is a block diagram showing an embodiment of the invention in which the conversion trigger generator is used as a 90°-phase shifter and zero cross detector.

FIG. 5 is still another detailed embodiment in which a phase shifter 45 is used to delay the phase of the exciting signal f(t) by 90 degrees and the comparator 41 is used to take zero cross points. The exciting signal f(t) is fed to the 90°-phase shifter 45 so that it is delayed in phase by 90 degrees. The delayed signal is compared to a reference value by the comparator 41 so that the zero cross point can be detected. The output from the comparator 41 is used as the conversion trigger. If the 90°-phase shifter 45 is formed of primary delay elements of a resistor and a capacitor, it is able to delay the phase of the exciting signal by about 90 degrees over a range from the cutoff frequency to a sufficiently high frequency.

Figure 6:
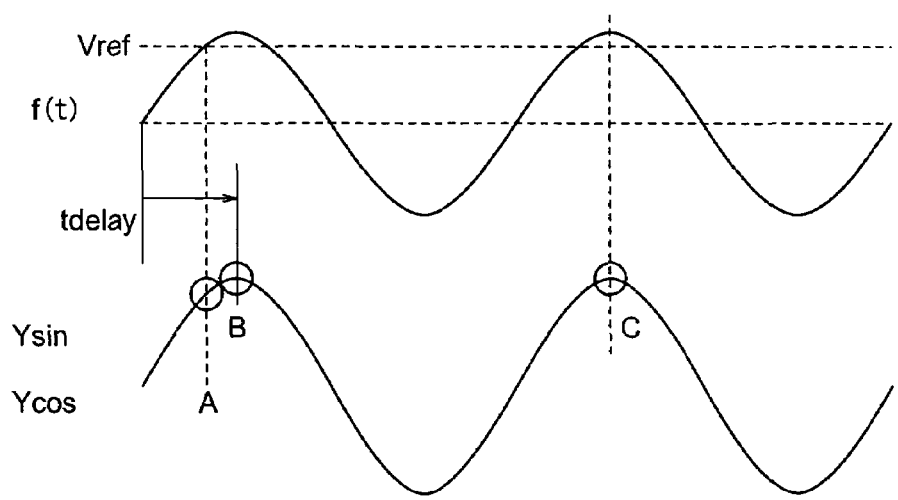
FIG. 6 is a waveform diagram showing an example of the operation of the conversion trigger generator.
Figure 12:
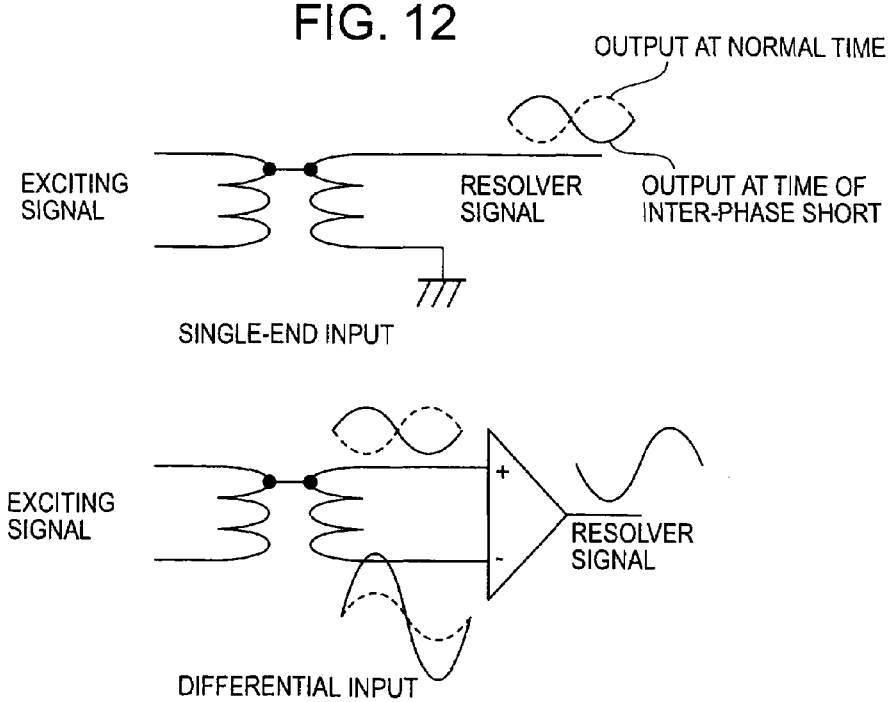
FIG. 12 is a diagram showing the waveform of resolver signals that is produced when an inter-phase short circuit occurs.

FIG. 6 is a waveform diagram showing the conversion timings for the resolver signals $Y_{sin}$ and $Y_{cos}$ in each embodiment shown in FIGS. 2 through 4. The abscissa is time, and the ordinate is the amplitudes of the resolver signals $Y_{sin}$ and $Y_{cos}$, and the exciting signal f(t). As illustrated in FIG. 12, the resolver signals $Y_{sin}$ and $Y_{cos}$ are converted at the time when the exciting signal f(t) reaches $V_{ref}$, or at point A. In the example of FIG. 3, the resolver signals are converted at the time when the exciting signal f(t) has progressed $t_{delay}$ from the zero cross point, or at time B. If $t_{delay} = \pi/(4\omega)$, the conversion is made at the peak of the signal, and thus it is optimum because the S/N ratio can be increased. According to the embodiment shown in FIG. 4, the resolver signals $Y_{sin}$ and $Y_{cos}$ are converted when the exciting signal f(t) reaches the peak.

Figure 7:
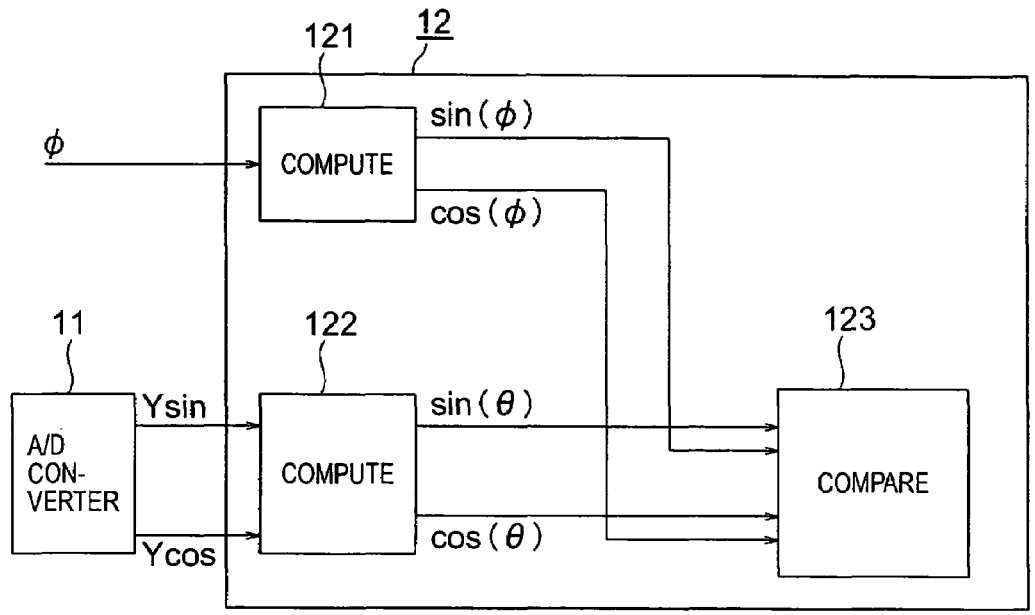
FIG. 7 is a block diagram showing an example of an error detecting function.
Figure 8:
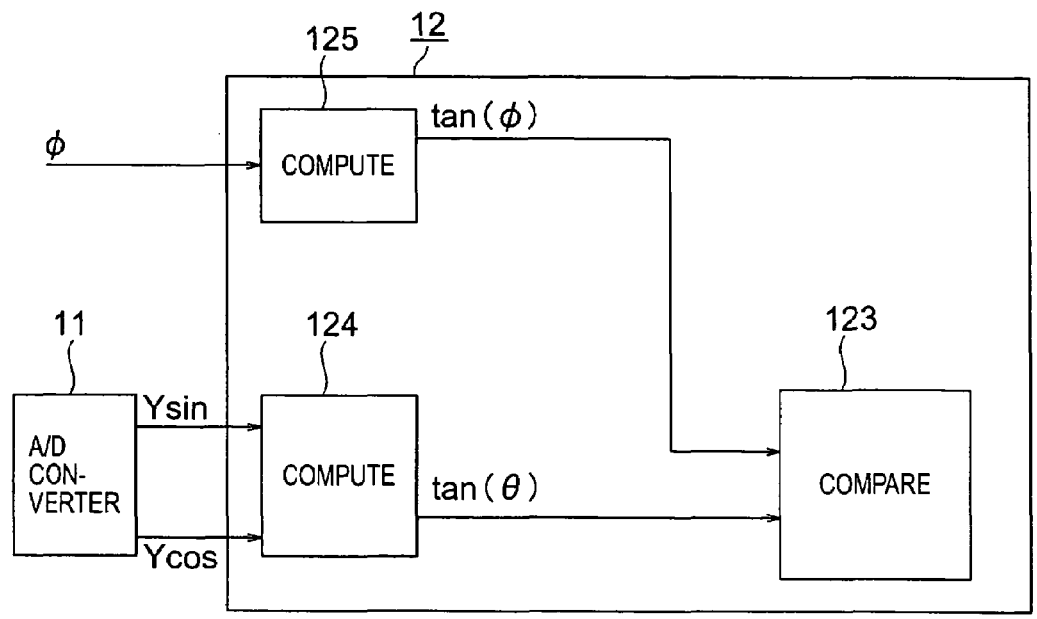
FIG. 8 is a block diagram showing another example of the error detecting function.
Figure 9:
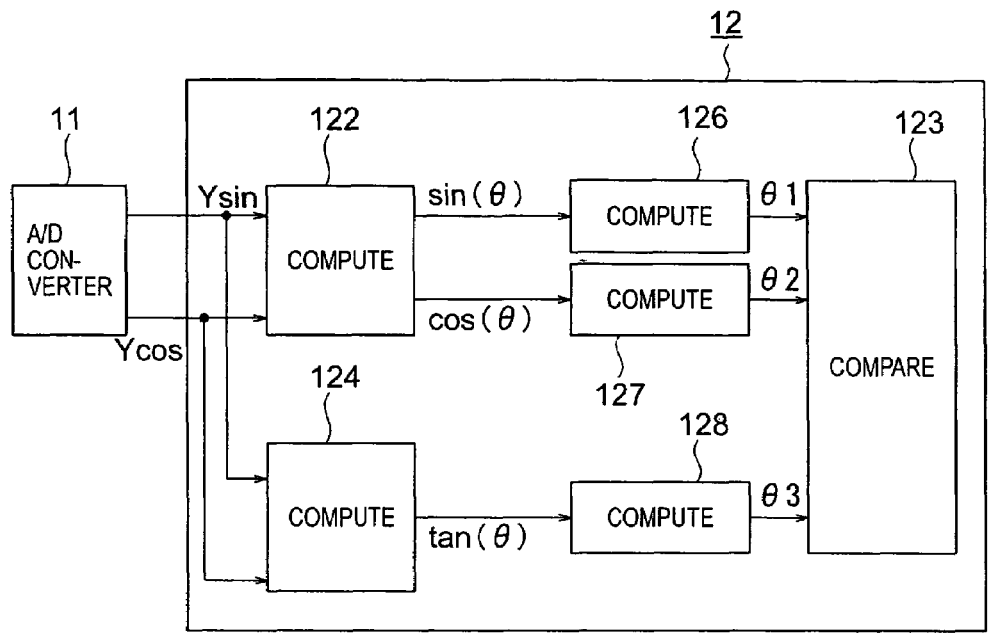
FIG. 9 is a block diagram showing still another example of the error detecting function.

FIGS. 7 through 9 show embodiments of an abnormality detecting function 12 that detects from those obtained signals $Y_{sin}$, $Y_{cos}$ the failure occurring in the resolver and resolver/digital converting portion. FIG. 7 shows a first embodiment of the abnormality detecting function 12.

First, a computing portion 122 finds $\sin(\theta)$ and $\cos(\theta)$ according to the following expressions.

$$\sin(\theta) = Y_{sin}/[SQRT(Y_{sin}^2 + Y_{cos}^2) \cdot V_{ref}]$$

$$\cos(\theta) = Y_{cos}/[SQRT(Y_{sin}^2 + Y_{cos}^2) \cdot V_{ref}]$$

A computing portion 121 finds $\sin(\phi)$ and cost on the basis of the estimated angle $\phi$. A comparing function 123 compares the values of $\sin(\theta)$ and $\cos(\theta)$ with the values of $\sin(\phi)$ and $\cos(\phi)$. If the differences are within the allowable ranges, the result is regarded as normal. If the differences are out of the allowable ranges, the result can be judged to be a failure. The failure of the resolver/digital converting portion can be detected by this method.

FIG. 8 shows another embodiment of the abnormality detecting function 12.

A computing portion 124 finds $\tan(\phi)$ from the following expression.

$$\tan(\theta) = Y_{sin}/Y_{cos}$$

A computing portion 125 finds $\tan(\phi)$ on the basis of the estimated angle $\phi$. The comparing function 123 compares the $\tan(\theta)$ and the $\tan(\phi)$. If the difference is within the allowable range, the result is regarded as normal. If the difference is out of the range, the result can be judged to be a failure. The failure of the resolver/digital converting portion can be detected by this method.

FIG. 9 is still another embodiment of the abnormality detecting function 12.

The computing portion 122 finds $\sin(\theta)$ and $\cos(\theta)$, and the computing portion 124 finds $\tan(\theta)$. Computing portions 126 through 128 respectively find $\theta_1$, $\theta_2$ and $\theta_3$ by substituting the obtained values of $\sin(\theta)$, $\cos(\theta)$ and $\tan(\theta)$ into the following expressions.

$$\theta_1 = a\ \sin(\sin(\theta))$$

$$\theta_2 = a\ \cos(\cos(\theta))$$

$$\theta_3 = a\ \tan(\tan(\theta))$$

The comparing function 123 compares the obtained values of $\theta_1$, $\theta_2$ and $\theta_3$ with each other. If the differences are within the allowable ranges, the result is regarded as normal. If the differences are out of the ranges, the result can be judged to be a failure.

This method is able to check the reasonableness of the signal from the resolver and detect the failure of the resolver itself.

Figure 10:
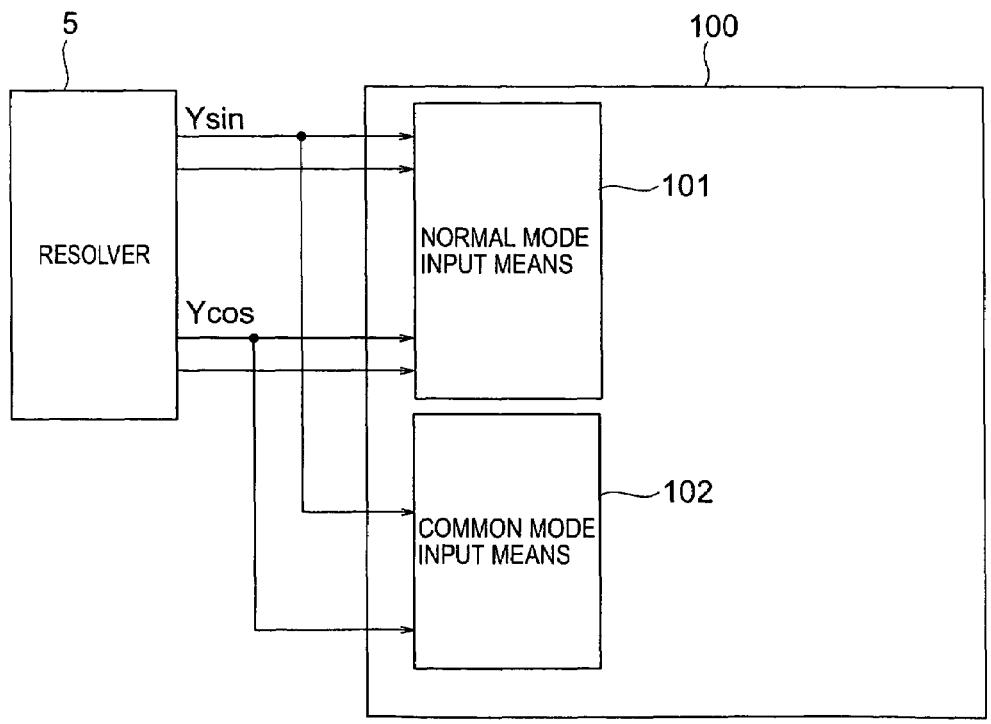
FIG. 10 is a block diagram showing an embodiment of the invention in which common mode input means and normal mode input means are provided.
Figure 11:
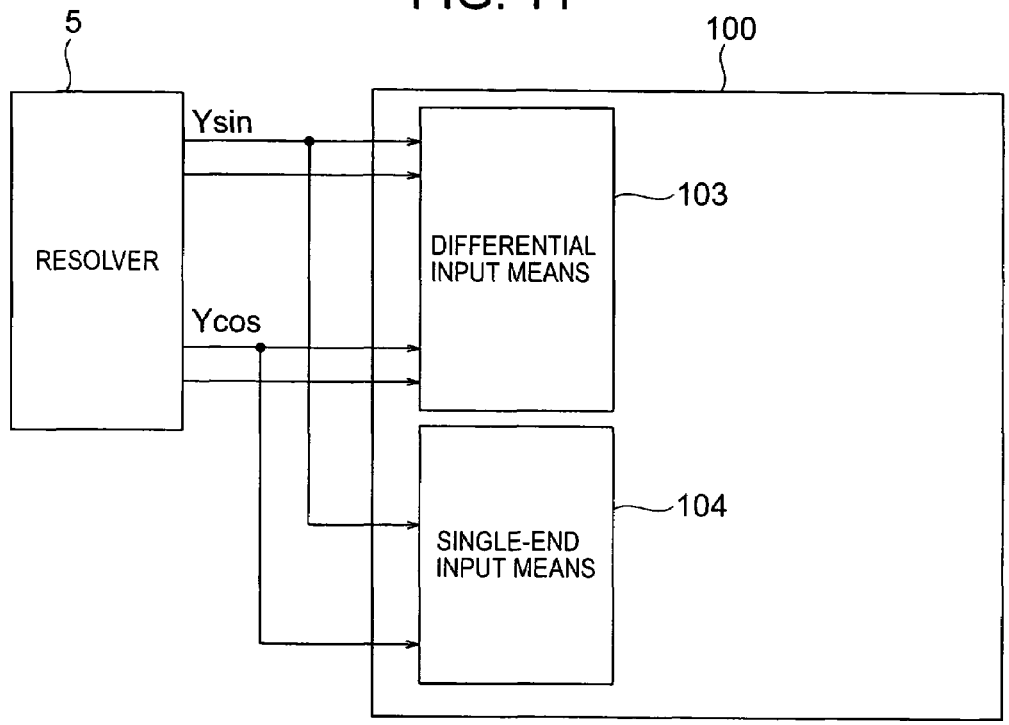
FIG. 11 is a block diagram showing an embodiment of the invention in which differential input means and single-end input means are provided.

FIG. 10 shows an embodiment of the controller 100 that has both normal mode input means 101 that supplies the normal components of resolver signals $Y_{sin}$ and $Y_{cos}$ to the next stage, and common mode input means 102 that supplies the common mode components of the resolver signals to the next stage. FIG. 11 shows another embodiment of the controller 100 that has both differential input means 103 that supplies the resolver signals $Y_{sin}$ and $Y_{cos}$ as differential signals to the next stage and single-end input means 104 that supplies the resolver signals as single end signals to the next stage.

If a short circuit occurs between the winding phases of the resolver (between the windings of exciting signal, sine signal and cosine signal), the normal resolver signals (broken line) cannot be obtained when a single-end configuration is used as shown in FIG. 12. The resolver signals are as indicated by the solid line because they are affected by the inter-phase short circuit. When a differential configuration is used, however, the component affected by the inter-phase short circuit is superimposed as a common mode component upon the original signal (normal mode component: broken line) to produce the waveform indicated by the solid line. Thus, if only a differential amplifier takes out the normal mode component, the original resolver signals (solid line) can be produced. Therefore, if the resolver signals $Y_{sin}$ and $Y_{cos}$ are received by differential-configuration input means, the inter-phase short circuit effect can be avoided. However, the occurrence of the inter-phase short circuit cannot be detected under this condition. Thus, if the common mode input means 102 or single end input means 104 is provided as in the examples of FIGS. 10 and 11 to detect the common mode component that is to be superimposed due to the inter-phase short circuit, a control system can be realized that is not affected by the inter-phase short circuit and that can detect the inter-phase short.

Figure 13:
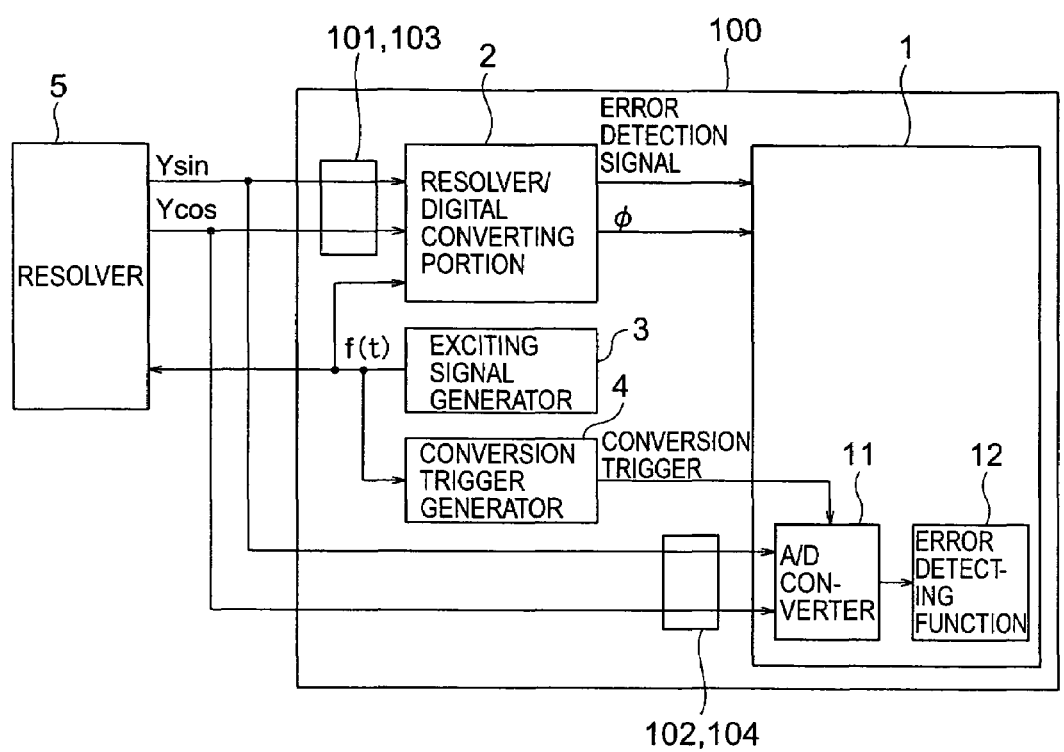
FIG. 13 is a block diagram of a detailed example of the embodiment shown in FIGS. 10 and 11.

FIG. 13 shows a specific example of FIGS. 10 and 11.

The resolver signals $Y_{sin}$ and $Y_{cos}$ produced from the resolver 5 are supplied through the normal mode input means 101 or differential input means 103 to the resolver/digital converting portion 2, and also fed through the common mode input means 102 or single end input means 104 to the A/D converter 11. Even if an inter-phase short circuit occurs, the resolver/digital converting portion 2 is not affected by the inter-phase short circuit, but can produce the estimated angle $\phi$ on the basis of the resolver signals $Y_{sin}$ and $Y_{cos}$. On the other hand, the input signals to the A/D converter 11 are affected by the inter-phase short circuit. If the error detecting function 12 monitors the input to the A/D converter 11, the inter-phase short circuit occurrence can be detected. When the short circuit occurs, the signal waveform of the signals supplied to the resolver/digital converting portion 2 that is not affected by the inter-phase short circuit is different from that fed to the A/D converter 11 that is affected by the inter-phase short circuit, and thus the inter-phase short circuit can be detected from the difference between the values of the trigonometric functions based on the signal waveforms or the estimated angles. The detection method in the error detecting function 12 may be the method shown in FIGS. 7 through 9.

Contrary to FIG. 13, the resolver signals $Y_{sin}$ and $Y_{cos}$ can be supplied through the common mode input means 102 or single end input means 104 to the resolver/digital converting portion 2, and also fed through the normal mode input means 101 or differential input means 103 to the A/D converter 11 of microcomputer, in which case the same effect can also be obtained.

Figure 14:
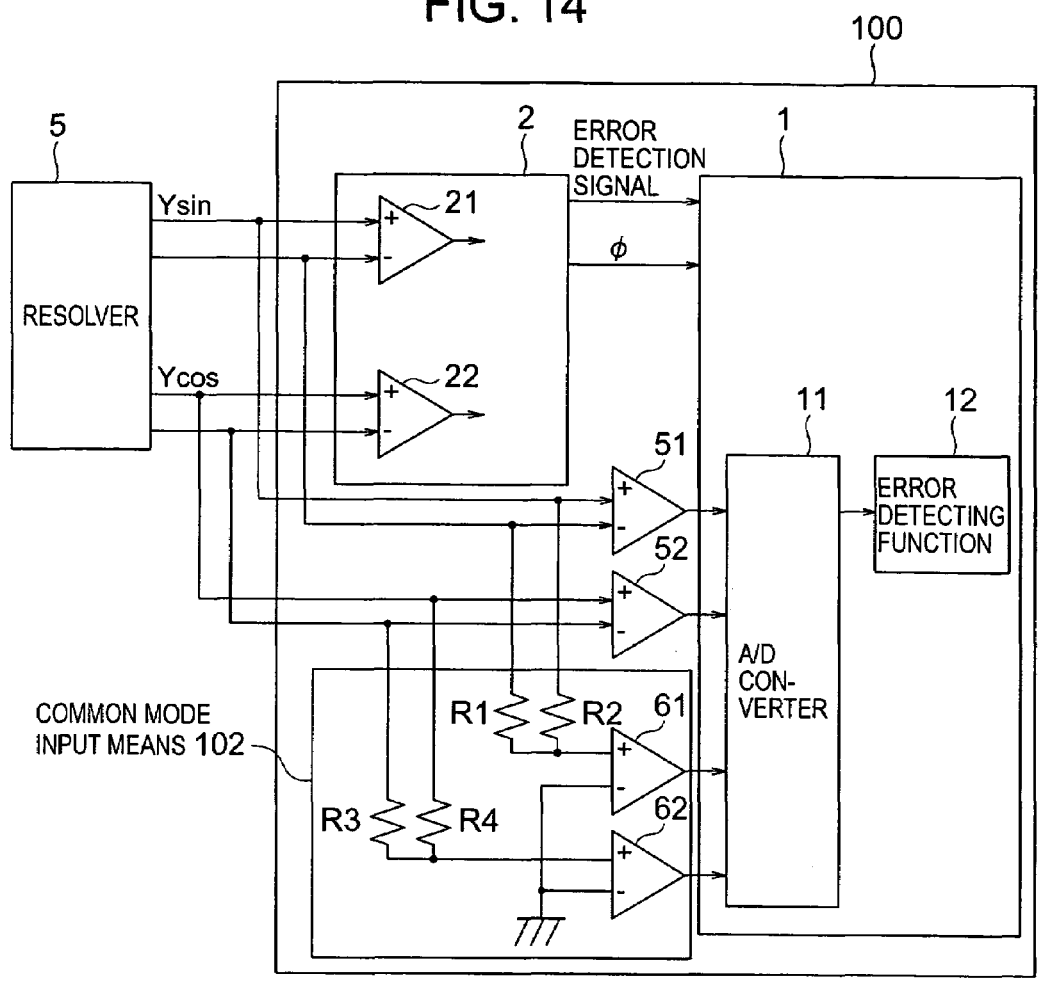
FIG. 14 is a block diagram showing an embodiment of the invention in which a common mode component detector is provided.

FIG. 14 shows a more specific example of FIGS. 10 and 13. The solver signals $Y_{sin}$ and $Y_{cos}$ are supplied to the resolver/digital converting portion 2 and to the A/D converter 11 of the microcomputer 1, and the common mode input means 102 is also provided. In FIG. 13, the exciting signal generator 3, resolver 5 and conversion trigger generator 4 are not shown for the sake of simplicity. The resolver/digital converting portion 2 also serves as the normal mode input means 101 that supplies the normal mode signals to the next stage or as the differential input means 103 that supplies the differential signals to the next stage. The resolver/digital converting portion 2 has, provided at the first stage, differential amplifiers 21 and 22 through which the resolver signals $Y_{sin}$ and $Y_{cos}$ can be received as differential signals. Differential amplifiers 51 and 52 are also provided before the A/D converter 11 of the microcomputer 1 in order to receive the resolver signals $Y_{sin}$ and $Y_{cos}$ as differential signals. In addition, resistors $R_1$, $R_2$ and resistors $R_3$, $R_4$ that constitute the common mode input means 102 can be used to add the common mode components of the resolver signals $Y_{sin}$ and $Y_{cos}$. As a result, operational amplifiers 61, 62 produce common mode components of resolver signals $Y_{sin}$ and $Y_{cos}$ with the normal mode components cancelled out.

Figure 15:
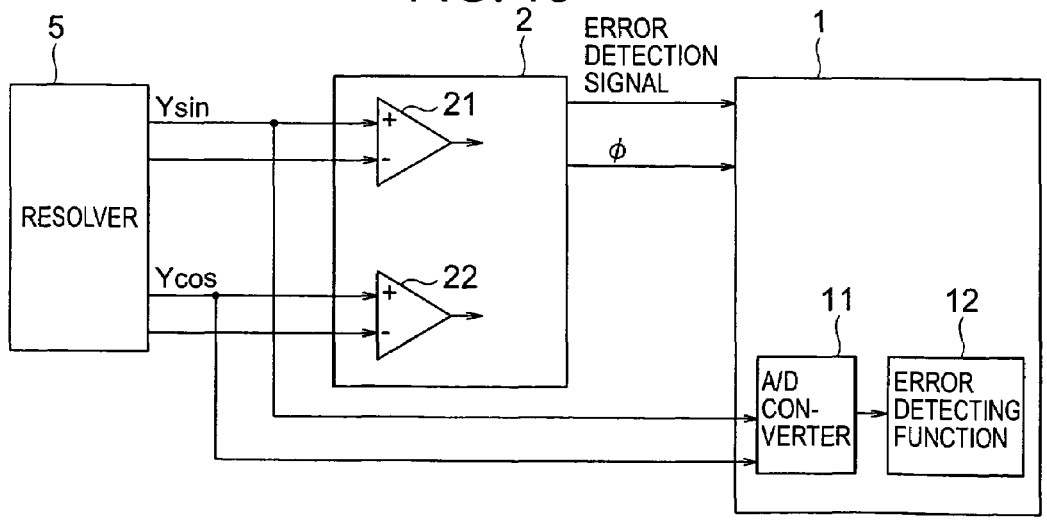
FIG. 15 is a block diagram showing an embodiment of the invention in which the resolver signals are supplied as differential signals to the resolver/digital converting portion and fed as single-end signals to the A/D converter of the microcomputer.

FIG. 15 shows another specific example of FIGS. 11 and 13. As illustrated in FIG. 15, if the resolver signals $Y_{sin}$ and $Y_{cos}$ are supplied as differential signals to the resolver/digital converter portion 2, and fed as single-end signals to the A/D converting portion 11 of microcomputer 1, the resolver/digital converting portion 2 is not affected by the inter-phase short circuit, but the signals affected by the inter-phase short circuit are fed to the A/D converter 11 of microcomputer 1. As a result, the inter-phase short circuit occurrence can be detected from the abnormality of signal waveforms. In this example, the resolver/digital converting portion 2 also serves as the differential input means 103 of FIG. 21, and the A/D converter 11 of microcomputer 1 also serves as the single-end input means 104.

Thus, as described above, the inter-phase short circuit occurrence can be detected from the abnormality of signal waveforms by use of the common mode input means 102 or single end input means 104. However, since the electric noise often comes as common mode components, use of single-end input means 104 for one input side as in the example of FIG. 13 results in the reduction of noise resistance so that the redundancy effect of the input circuits 103, 104 is reduced. Thus, examples for detecting the inter-phase short circuit occurrence with the noise resistance kept are shown in FIGS. 16 through 25.

Figure 16:
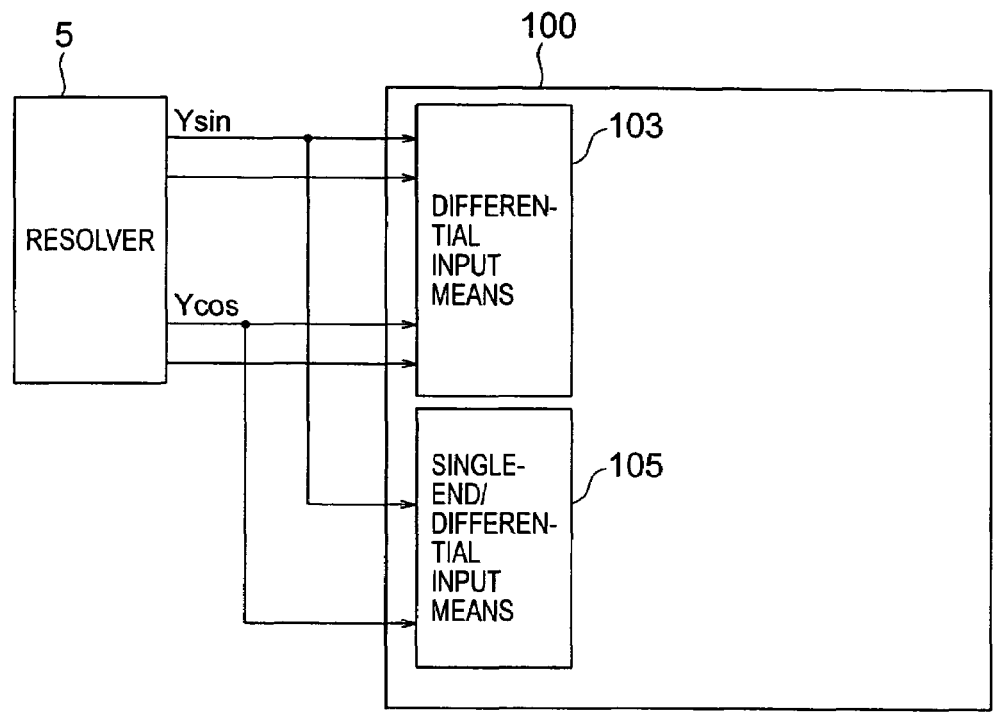
FIG. 16 is a block diagram of an embodiment of the invention in which the differential input signals and single-end input signals are switched and fed to the A/D converter of the microcomputer.

FIG. 16 shows an embodiment of the invention in which a single-end/differential input means 105 and the differential input means 103 are provided that are supplied with the resolver signals $Y_{sin}$ and $Y_{cos}$. This single-end/differential input means 105 switches the single end input means and differential input means and receives the resolver signals through the selected input means. As illustrated, the single-end/differential input means 105 is used instead of the single end input means 104 in order to normally supply the redundant differential input signals to the next stage, and when a diagnosis is made in booting the system just after the power supply is turned on, to supply the single end signals to the next stage so that the inter-phase short circuit can be detected.

Figure 17:
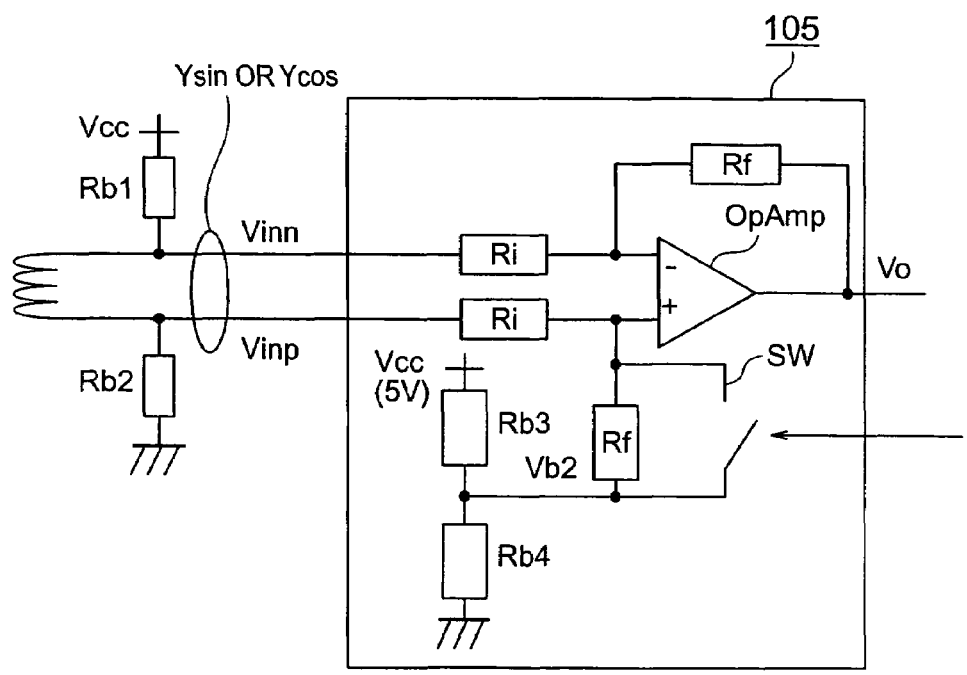
FIG. 17 is a block diagram showing a detailed example of the embodiment shown in FIG. 16.

FIG. 17 shows a specific example of the single-end/differential input means 105. The single-end/differential input means 105, as illustrated, has an operational amplifier OpAmp, a switch SW, and resistors. The output Vo of the operational amplifier OpAmp is supplied to and converted by the A/D converter 11 not shown to digital data. In order for the controller 100 to reduce the size and weight, it is desired to incorporate the A/D converter 11 in the microcomputer 1 not shown, but it may be discrete as long as the function can be kept. The switch SW is desired to control by the microcomputer 1, but it is not always necessary to do so.

The resistors $R_{b3}$, $R_{b4}$ are used to divide the power supply voltage $V_{cc}$ and supply a bias voltage (center voltage) to the signals fed from the resolver. If $R_{b1}=R_{b2}$, the bias voltage (center voltage) equals to $V_{cc}/2$. The resistors $R_{b3}$, $R_{b4}$ are used to divide the source voltage $V_{cc}$ to produce a voltage $V_{b2}$. If $R_{b3}=R_{b4}$, the voltage $V_{b2}$ equals to $V_{cc}/2$. The signal $Y_{sin}$ or $Y_{cos}$ from the resolver is differentially supplied as an input voltage $V_{inp}$, $V_{inn}$ in this circuit, or each signal $Y_{sin}$ or $Y_{cos}$ is fed to each of two circuits that constitute the single-end/differential input means 105.

The relation between the input voltage $V_{inp}$, $V_{inn}$ and output voltage $V_o$ is as follows.

When the switch SW is opened, the equation of $$V_o = R_f/R_i(V_{inp}-V_{inn})+V_{b1}$$

is satisfied.

When the switch SW is closed, the equation of $$V_o = R_f/R_i(V_{b1}-V_{inn})+V_{b1}$$

is satisfied.

Therefore, when the switch SW is opened, the single-end/differential input means operates as the differential input means, and when the switch SW is closed, it operates as the single end input means. In other words, the differential input means and single-end input means can be switched by opening and closing the switch SW.

In addition, even if the input means to which the signals are fed from the resolver is not made to be redundant, the input means can be constructed as the single-end/differential input means 105. According to this embodiment, the input means can be operated as a differential input means in the normal mode, and operated as a single-end input means in the mode in which the system makes a diagnosis while it is being booted immediately after the power supply is turned on, so that the inter-phase short circuit can be detected.

Figure 18:
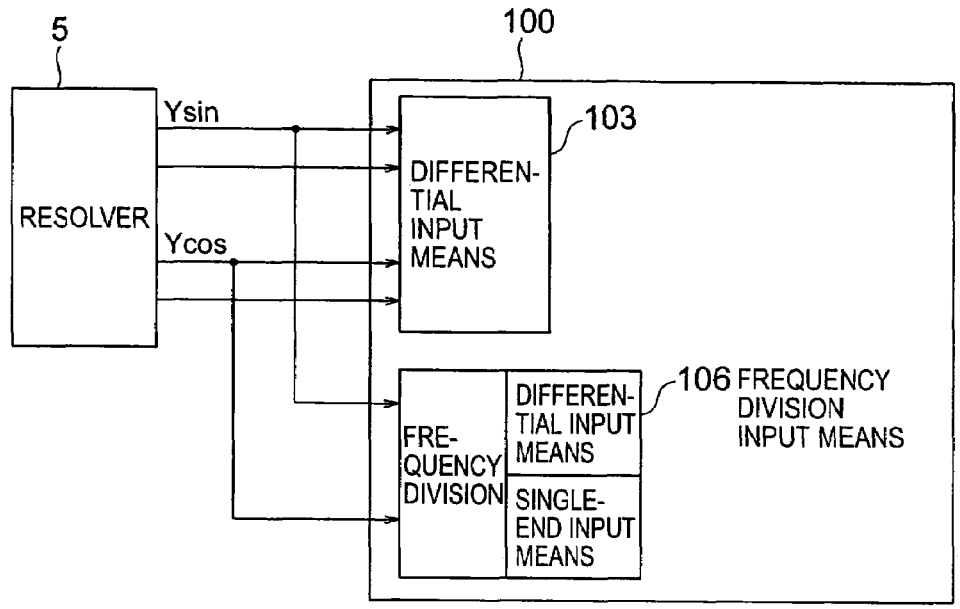
FIG. 18 is a block diagram showing an embodiment of the invention in which the differential input means and single-end input means are operated in a frequency division manner.

FIG. 18 shows an embodiment in which the differential input means 103 is provided to receive the resolver signals $Y_{sin}$, $Y_{cos}$ and supply differential input signals to the next stage, and frequency division input means 106 is provided to receive the resolver signals and supply the single-end input and differential input signals in a frequency division manner to the next stage. According to this embodiment, the differential input means that is resistant to noise is used for the frequency region including noise components, and the single-end input means is used for the frequency band that is little affected by noise components but much affected by the inter-phase short circuit, so that both inter-phase short detecting function and noise resistance can be made compatible. The frequency division input means 106 can be realized by inserting filters (high-pass filter, low-pass filter, band-pass filter and band-stop filter) having pass characteristics depending upon frequency in one of the two input lines of the differential input circuit, or inserting filters having different pass characteristics depending upon frequency in the two input lines. FIGS. 19 through 25 show detailed examples of the input means.

Figure 19:
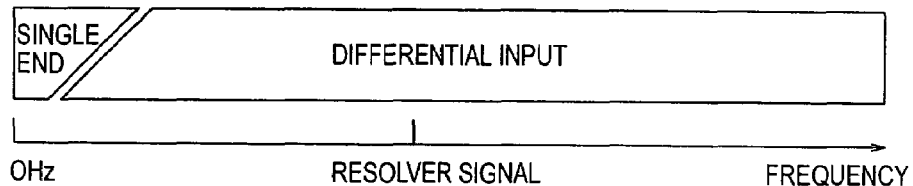
FIG. 19 is a diagram showing an example of the frequency characteristic for the frequency division in the embodiment shown in FIG. 18.

FIG. 19 shows an example of the characteristics of input means 106 designed to serve as the single-end input means for the lower frequency region and as the differential input means for the higher frequency region including the resolver signal frequency. This example is effective particularly when the resolver signal frequency and higher frequency region are affected by noise and when the inter-phase short effect appears in the lower frequency region. For example, when the switching frequency of the PWM inverter for driving a motor is near the resolver signal frequency, the resolver frequency and higher frequency region are affected by noise.

In addition, if a different center voltage (bias voltage) is used for each phase, the lower frequency region is affected by the inter-phase short circuit. For example, since the input voltage range of the resolver signals $Y_{sin}$, $Y_{cos}$ to the resolver/digital converting portion 2 and A/D converter 11 is normally from 0 to 5 volts, the center voltage (bias voltage) is generally fixed to about 2.5 V. In addition, since the exciting signal produced from the exciting signal generator 3 is desired to be as large as possible in order for the S/N ratio to be raised, the center voltage (bias voltage) is usually set at about ½ the battery voltage. If the battery voltage is 12 V, the center voltage is fixed to 6 V. When considering that the battery voltage is gradually reduced while it is being operated, the center voltage (bias voltage) is generally fixed to about 4~5 V. Therefore, when the inter-phase short circuit occurs between the resolver signal $Y_{sin}$, $Y_{cos}$ and the exciting signal, the center voltage (bias voltage) of the resolver signal $Y_{sin}$, $Y_{cos}$ is pulled to rise from about 2.5 V up to the center voltage (bias voltage) of the exciting signal, and thus the short circuit can be detected from this change. In addition, if the center voltage (bias voltage) of the resolver signal $Y_{sin}$, $Y_{cos}$ is slightly varied around 2.5 V, the inter-phase short circuit between the resolver signals $Y_{sin}$, $Y_{cos}$ can be similarly detected from this change.

Figure 20:
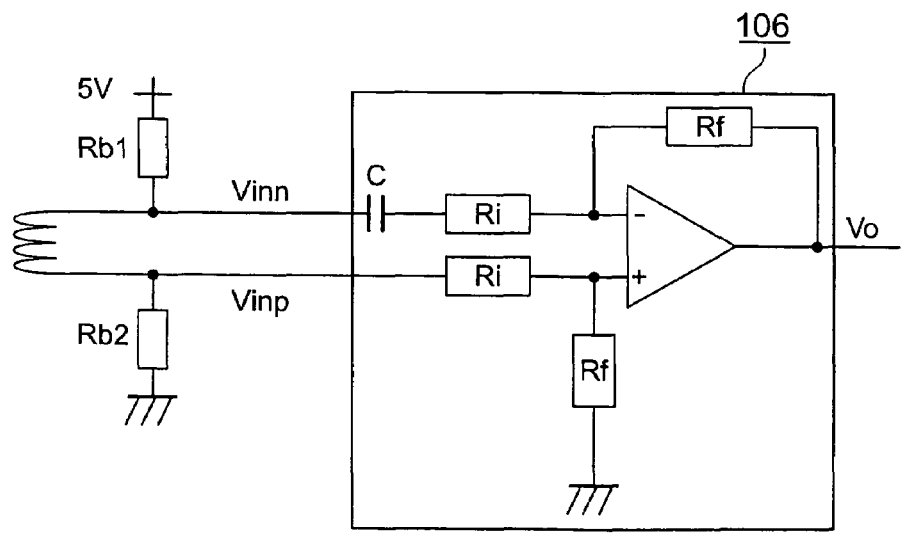
FIG. 20 is a block diagram showing an example for implementing the frequency division shown in FIG. 19.

In order to achieve the frequency characteristic shown in FIG. 19, it is necessary that a high-pass filter be inserted in one of the two input lines of the differential input circuit. FIG. 20 shows a specific example of this case. This circuit arrangement has a capacitor C inserted in series with one input line of the two input lines of the normal differential input circuit. This capacitor makes the input circuit be a single-end input circuit in terms of DC and makes it be a differential input circuit in terms of AC. The signal $Y_{sin}$ or $Y_{cos}$ from the resolver is differentially supplied as the input voltages $V_{inp}$ and $V_{inn}$ to this input circuit. Thus, the frequency-division input means 106 is constructed by a circuit for each signal $Y_{sin}$ or $Y_{cos}$, or by two circuits for both signals.

If the capacitor C in FIG. 20 is imaginarily opened, an equivalent circuit for DC region is obtained. The input/output relation in this equivalent circuit can be expressed by the following equation.

$$V_o = R_f V_{inp}(R_i + R_f)$$

If the capacitor C in FIG. 20 is imaginarily shorted, an equivalent circuit for AC region is obtained. The input/output relation of this equivalent circuit is given by $$V_o = R_f/R_i(V_{inp} - V_{inn})$$

Thus, for AC region this circuit arrangement operates as a differential input configuration, and for DC region it operates as a single-end input configuration. Therefore, the frequency characteristic shown in FIG. 19 can be achieved by this example, and thus the inter-phase short circuit detection function and the resistance to noise can be made compatible.

Figure 21:
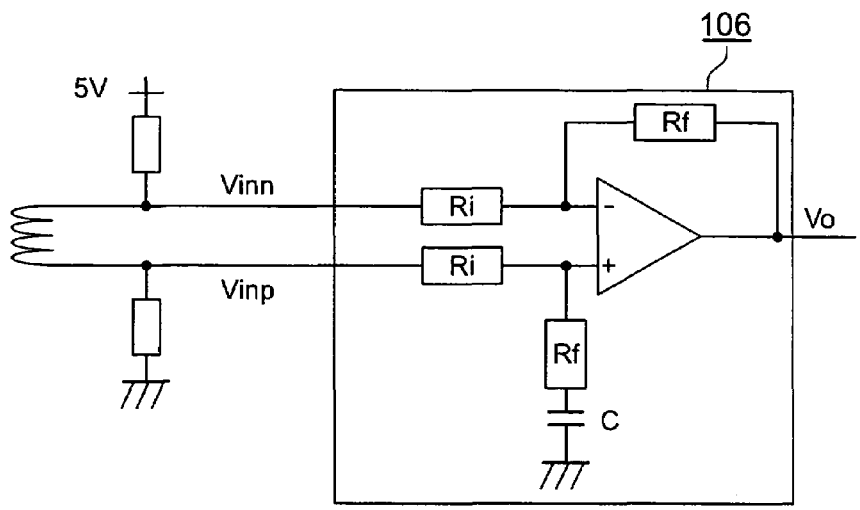
FIG. 21 is a block diagram showing another example for implementing the frequency division shown in FIG. 19.

FIG. 21 shows another embodiment of the frequency-division input means 106 in which the gain for DC region is fixed at 1.

The input/output relation for AC region is the same as in FIG. 20, or given by $$V_o = R_f R_i(V_{inp} - V_{inn})$$

The input/output relation for DC region is as follows. The input signal $V_{inp}$ is not divided, but directly supplied to the + input terminal of the operational amplifier, and the output voltage $V_o$ is controlled so that the − input terminal of the operational amplifier can be maintained at $V_{inp}$. That is, $$V_{inp} = (R_f V_{inn} + R_i V_o)/(R_i + R_f)$$

For DC region, $V_{inp} = V_{inn}$ is satisfied, and thus.

$$V_o = V_{inp}$$

From the above, it will be understood that for AC region the input means operates as a differential input configuration and for DC region the input means operates as a single-end input configuration of gain 1. According to this example, since the gain for DC region can be fixed at 1, the center values of the signals in the differential input means 103, frequency-division input means 106 and the following-stage A/D converter 11 can be set to be the optimum points for treating the maximum amplitude, or ½ the operating source voltage to the circuits.

Figure 22:
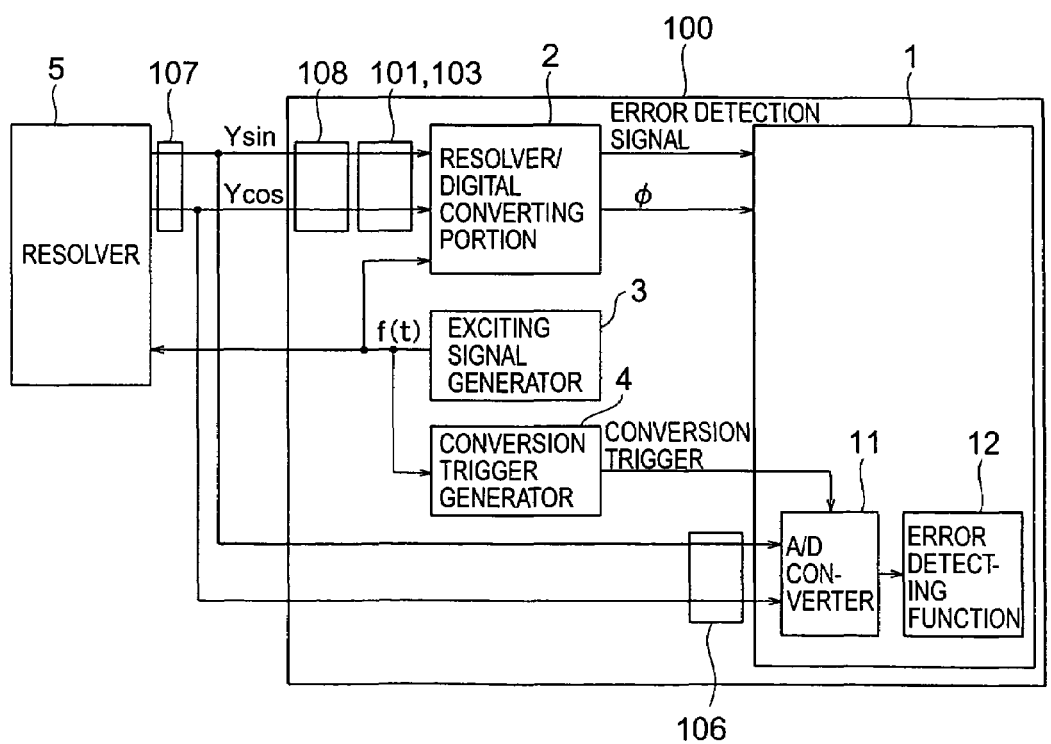
FIG. 22 is a block diagram showing an embodiment of the invention in which a bias correcting function is provided.

FIG. 22 shows an embodiment of the invention in which it is prevented that, if the center voltages (bias voltages) of the signals $Y_{sin}$, $Y_{cos}$ are made different in order to detect the inter-phase short circuit between the signals $Y_{sin}$, $Y_{cos}$, the center voltage (bias voltage) of the input signal to the resolver/digital converter 2 may be deviated from an ideal value (for example, 2.5 V) to cause the waveforms of the upper and lower ends of the signal to be clipped due to the saturation, thus limiting the maximum amplitude. In this embodiment, a bias applying circuit 107 is provided to apply different center voltages (bias voltages) to the signals $Y_{sin}$, $Y_{cos}$. Then, a bias correcting circuit 108 adds a correction bias to correct the center voltages (bias voltages) into an ideal value (for example, 2.5 V), and supplies the corrected signals to the normal mode input means 101 or differential input means 103 that are placed at the input stage of the resolver/digital converter 2. Therefore, when the inter-phase short circuit does not occur, the signals $Y_{sin}$, $Y_{cos}$ fed to the resolver/digital converter 2 have an ideal value (for example, 2.5 V) as their center voltage (bias voltage) since they are corrected after predetermined different center voltages (bias voltages) are added to the resolver signals, and thus those signals have the ideal value (for example, 2.5 V) as the center voltage (bias voltage). When the inter-phase short circuit occurs, the center voltages applied to the signals $Y_{sin}$, $Y_{cos}$ are deviated from a certain value, and thus the signals $Y_{sin}$, $Y_{cos}$ fed to the resolver/digital converting portion 2 also have the center voltages (bias voltages) deviated from the ideal value (for example, 2.5 V) so that the inter-phase short circuit occurrence can be detected.

Also, even if the resolver signals are received by the differential input means but not the single-end input means, the waveforms of the upper and lower ends of the signal of a narrow input voltage range are clipped due to saturation, and thus the inter-phase short circuit can be detected as abnormal waveforms.

This embodiment functions effectively when the input voltage range to the resolver/digital converting portion 2 is narrow. However, when the input voltage range to the A/D converter 11 or common mode input means 102 or single-end input means 104 is narrow, the bias correcting circuit 108 is similarly needed to place before the common mode input means 102 or single-end input means 104.

Figure 23:
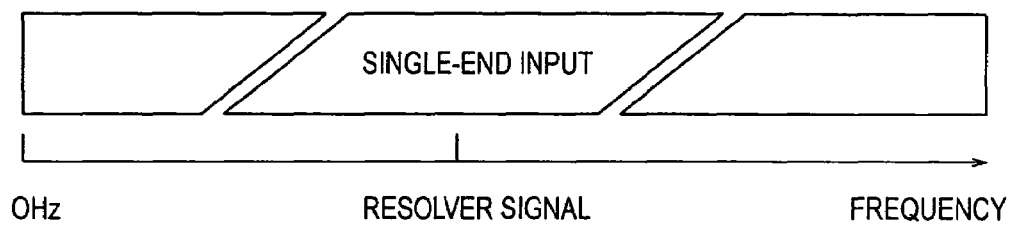
FIG. 23 is a diagram showing another example of the frequency characteristic for the frequency division in the embodiment shown in FIG. 18.

FIG. 23 shows an example of the frequency characteristic of the frequency division input means 106 that takes the single-end input configuration for the frequency region around the resolver signal frequency. This example is effective particularly when the region around the resolver signal frequency is little affected by noise, but when the other frequency regions are much affected by noise. For example, this corresponds to the case when the switching frequency of the PWM inverter for driving the motor that is the main noise source is much lower or much higher than the resolver signal frequency.

The following three methods can be considered in order to achieve the frequency characteristic shown in FIG. 23.

The first method is that a filter for eliminating the frequency region around the resolver signal frequency is inserted in one of the two input lines of the differential input circuit. According to this method, the differential input means functions for the other frequency regions.

The second method is that a high-pass filter with a cutoff frequency sufficiently lower than the resolver signal frequency is inserted in one of the two input lines of the differential input circuit and that another high-pass filter with a cutoff frequency sufficiently higher than the resolver signal frequency is inserted in the other line. According to this method, the differential input means functions for the frequency band higher than the resolver signal frequency region, but the lower frequency band than the resolver signal frequency region is cut off.

The third method is that a low-pass filter with a cutoff frequency sufficiently lower than the resolver signal frequency is inserted in one of the two input lines of the differential input circuit and that a low-pass filter with a cutoff frequency sufficiently higher than the resolver signal frequency is inserted in the other line. According to this method, the differential input means operates for the lower frequency band than the resolver signal frequency region, but the higher frequency band than the resolver signal frequency region is cut off.

Figure 24:
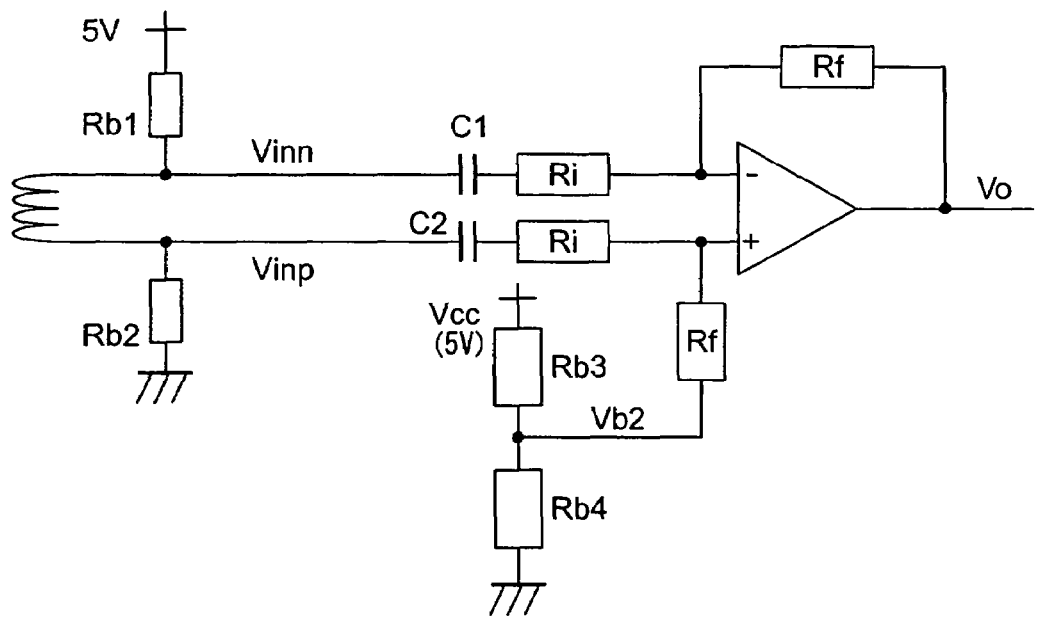
FIG. 24 is a block diagram showing an example for implementing the frequency division shown in FIG. 23.

FIG. 24 shows an example of the circuits for implementing the second method. The cutoff frequency of the high-pass filter can be substantially determined by the time constants of $C_1 \cdot R_i$, $C_2 \cdot R_i$.

Here, under the condition of $$1/(2\pi C_1 \cdot R_i) < f_{rez} < 1/(2\pi C_2 \cdot R_i)$$

where $f_{rez}$ is the frequency of the resolver signals, the very high frequency region of $f << 1/(2\pi C_1 \cdot R_i)$ to the + input end and − input end of the operational amplifier is cut off, resulting in $$V_o = V_{b2}$$

The frequency region of $$1/(2\pi C_1 \cdot R_i) << f << 1/(2\pi C_2 \cdot R_i)$$

to the + input end of the operational amplifier is cut off, resulting in $$V_o = R_f (V_{b2} - V_{inn})/R_i + V_{b2}$$

and thus the single-end operation.

The very high frequency region of $1/(2\pi C_2 \cdot R_i) << f$ is passed through the + input end and − input end of the operational amplifier, resulting in $$V_o = R_f (V_{inp} - V_{inn})/R_i + V_{b2}$$

and thus the differential input operation.

According to the examples shown in FIGS. 15 through 24 mentioned above, a control system can be achieved that is not affected by the inter-phase short but that can detect the inter-phase short.

Thus, according to the above examples, as listed in FIG. 25, the failure (1) of the abnormality of waveforms due to the disconnection of the signal from or to the resolver can be detected by the failure detecting function provided in the resolver/digital converter 2 and the error detecting function 12 of the invention.

In addition, since the function to detect the failure (1) and notify the microcomputer is redundantly provided in the resolver/digital converting portion 2 and detecting function 12, the failure (2) of the function to detect the failure (1) and notify the microcomputer can be detected by the other function even if one function breaks down.

The failure (3) of the resolver/digital converter function itself for finding θ on the basis of the signal from the resolver can be detected by the failure detecting function provided in the resolver/digital converting portion 2 and the error detecting function 12 of the invention.

In addition, since the function to detect the failure (3) and notify the microcomputer is redundantly provided in the resolver/digital converting portion 2 and the detecting function 12, the failure (4) of the function to detect the failure (3) and notify the microcomputer can also be detected by the other function even if one function goes out of order.

Thus, according to the above examples, the failures of the resolver and resolver/digital converter can be detected. If a failure is detected in the application to the motor-driven power steering apparatus or the like, the motor-driven assist mechanism is stopped, thus the fail-safe operation being assured. In addition, since the system operation is not allowed to stop in x-by-write, particularly steer-by-wire or fly-by-wire, the fault tolerance is demanded that can continue the operation even when a failure occurs. Thus, as illustrated in FIG. 26, if resolvers 5-1, 5-2 and resolver/digital converting portions 2-1, 2-2 are doubly provided, and combined with the error detecting function 12, a triple system can be substantially achieved to form a fault tolerance system. If one of the double resolvers 5-1, 5-2 and resolver/digital converting portions 2-1, 2-2 breaks down, the failure can be detected by the failure detecting function provided in the resolver/digital converting portions 2-1, 2-2 and the error detecting function 12, and the defective portion can be located. Then, the failure-free ones of the double resolvers 5-1, 5-2, resolver/digital converting portions 2-1, 2-2 can be used to maintain the operations. It would be further desirable to make the microcomputer 1 be a multiple structure.

Figure 27:
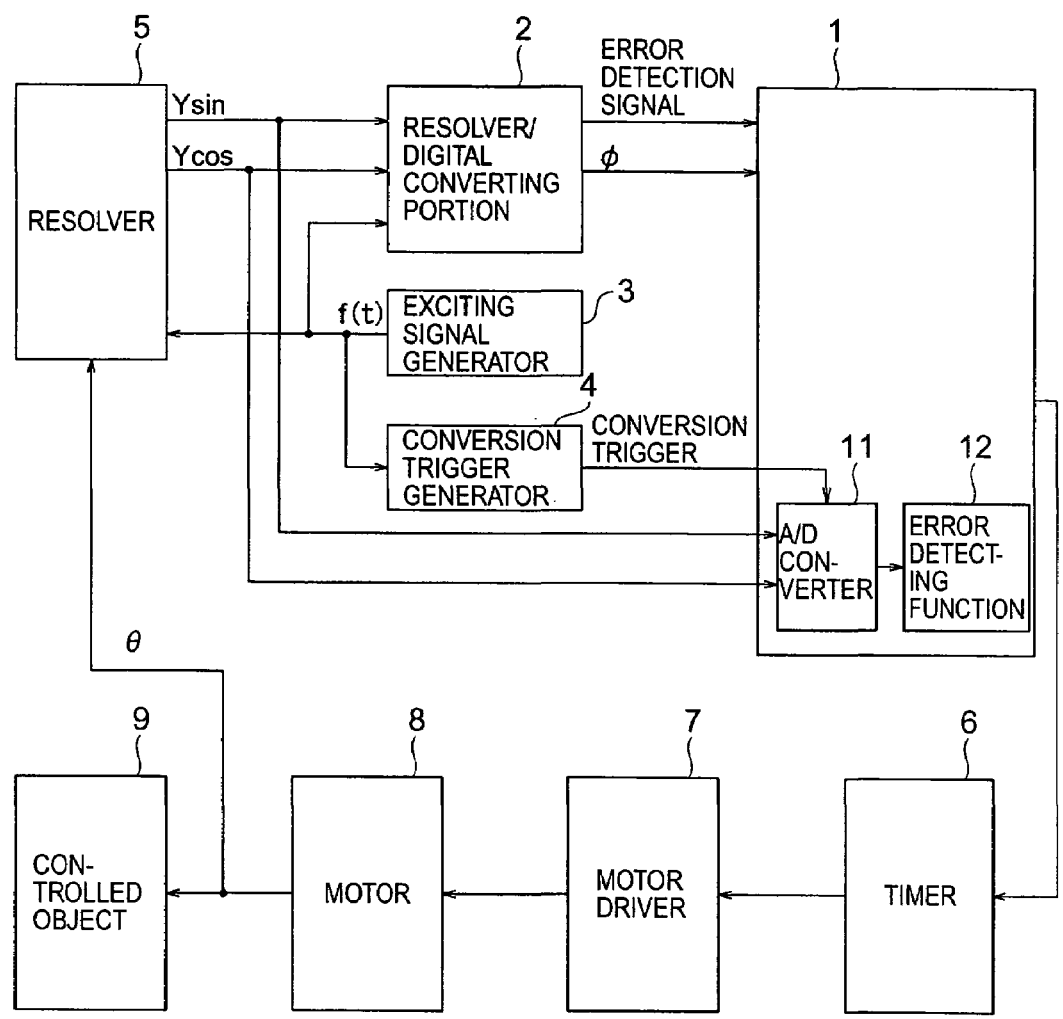
FIG. 27 is a block diagram showing an embodiment of a motor control system according to the invention.

FIG. 27 shows an embodiment of a motor control system according to the invention. The microcomputer 1 is responsive to the estimated angle φ from the resolver/digital converting portion 2 to supply a motor-drive command to a timer 6 that generates a PWM signal. The timer 6 responds to the command from the microcomputer 1 to generate the PWM signal of a predetermined duty cycle. A motor driver 7 drives a motor 8 according to the waveform of the PWM signal. The output shaft of motor 8 is connected to a controlled object 9 and thus moves the controlled object 9. The output shaft of the motor is also connected to the resolver 5 by which the rotation angle is measured. The rotation angle is supplied to the microcomputer 1.

In the motor-driven power steering control apparatus, the controlled object 9 is the whole steering system. In the steer-by-wire control apparatus, the controlled object 9 is the steering column and steering mechanism (steerage apparatus).

Figure 28:
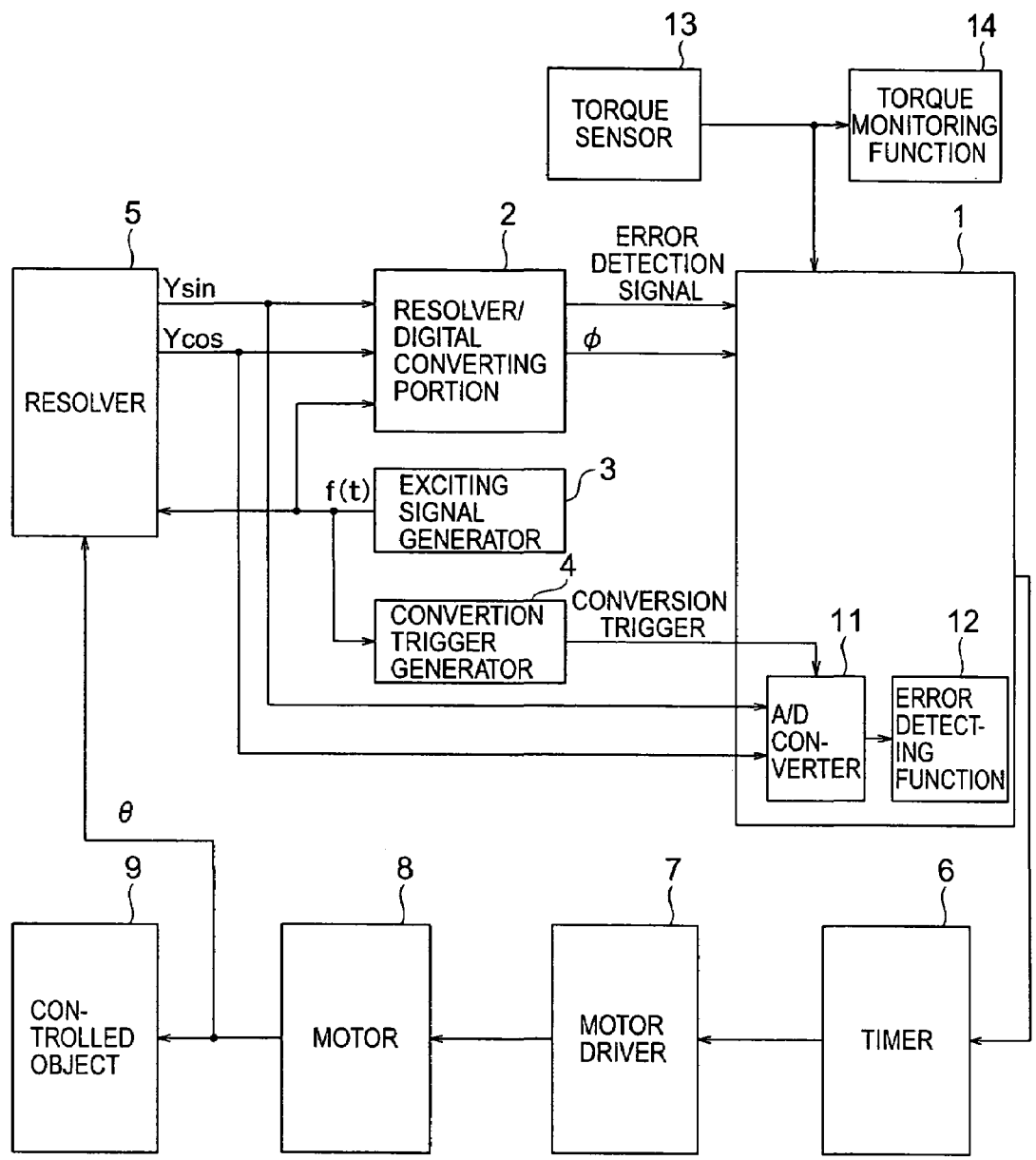
FIG. 28 is a block diagram showing an embodiment of a power steering apparatus according to the invention.

Also, in the power steering control apparatus, as illustrated in FIG. 28, a torque monitoring function 14 is used to monitor the torque signal from a torque sensor 13, thus further improving the safety. The function of power steering apparatus is to assist the steerage by motive energy and to thereby alleviate the driver's steering force. In case that the power steering apparatus operates contrary to the driver's will due to a failure, the driver should exert an unusual steering force (torque) against this operation. Thus, the torque monitoring function 14 detects the driver's unusual steering force (torque) when the power steering apparatus breaks down, and stops the assist mechanism, thus assuring the failsafe operation.

Figure 29:
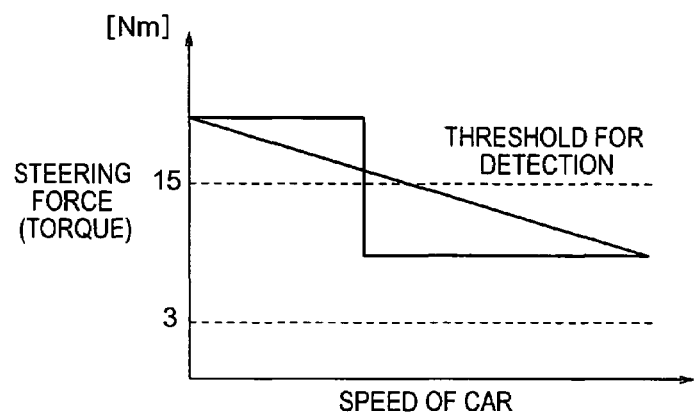
FIG. 29 is a diagram of an example showing the threshold for detecting abnormality is changed with the change of car speed.

When the steering force is aided by the power steering, the steering force (torque) is substantially 2 to 3 (Nm), but when the driver widely turns the steering wheel, it is about 15 (Nm). Therefore, when the driver exerts a steering force (torque) that exceeds 20 to 30 (Nm) including a margin, the power steering apparatus is regarded as being broken down, and the assist mechanism is stopped so that the failsafe operation can be assured. In addition, since the widely turning of the steering wheel is limited to the low speed of car, various thresholds to the steering force (torque) are provided for the detection of the abnormality in different speeds of car as shown in FIG. 29. The threshold is stepwise changed in accordance with the speed range of car. That is, for high speed the threshold is selected to be 5 to 6 (Nm) and for low speed it is fixed to 20 to 30 (Nm). Alternatively, by continuously changing the threshold according to the car speed, it is possible to precisely detect the abnormality. Moreover, in order that the assist mechanism can be prevented from being stopped when the steering torque is transient and thus normal, it can be considered that the assist mechanism is stopped when the steering force continues to exceed the above threshold during a constant time or above.

Figure 30:
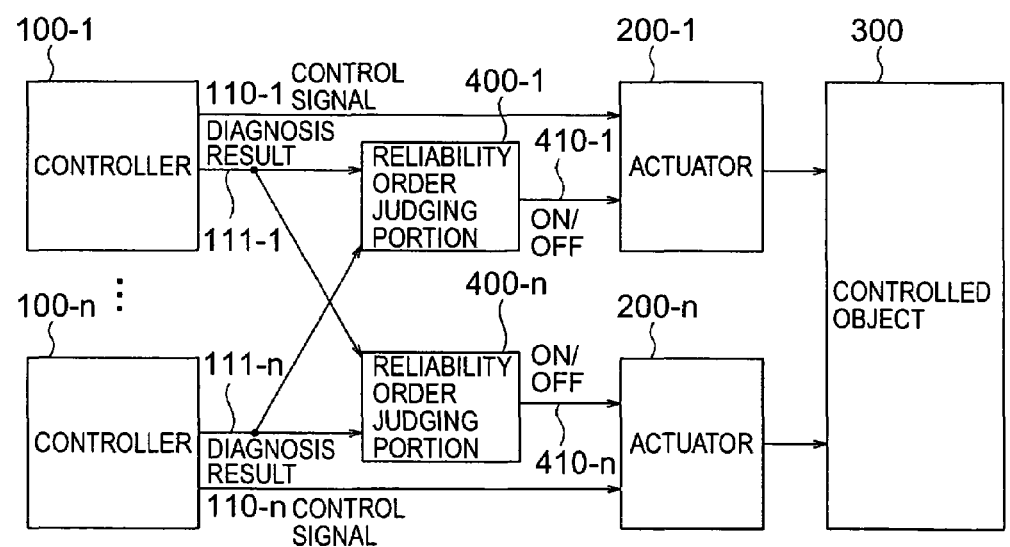
FIG. 30 is a block diagram showing an embodiment of the invention in which reliability order judging portions are provided.

FIG. 30 shows an embodiment of a redundant-structure control apparatus. Redundant multiple controllers 100-1 to 100-n supply control signals 110-1 to 110-n as control commands to actuators 200-1 to 200-n. The controllers 100-1 to 100-n also produce the results 111-1 to 111-n of their own diagnosis. Reliability order judging portions 400-1 to 400-n produce ON/OFF signals 410-1 to 400-n on the basis of the diagnosis results 111-1 to 111-n supplied from the controllers 100-1 to 100-n.

The actuator 200-i, when the input ON/OFF signal 410-i is ON, controls a controlled object 300 to act by the amount based on the inputted control signal 110-i. When the input ON/OFF signal 410-i is OFF, it does not control the controlled object 300.

FIG. 31 shows a table of the judgment in the reliability order judging portions 400-1 to 400-n, or the relation between the diagnosis result 111-1 to 111-n and the ON/OFF signal 410-1 to 410-n. In this table, if the reliability order judging portion 400-1 is now taken as an object of interest, its number is i=1, and the numbers of the other related objects are j=2~n. Also, if the reliability order judging portion 400-2 is now taken as an object of interest, its number is i=2, and the numbers of the other related objects are j=1, 3 ~n. As shown in this table, when the failure grade of an object of interest based on the diagnosis result 111-i from this object is lower than those of the other objects based on the diagnosis results 111-j from the other objects, the ON/OFF signal 410-i of interest is turned ON. On the contrary, when the failure grade of an object of interest based on the diagnosis 111-i is higher than those of the other objects based on the diagnosis results 111-j from the other objects, the ON/OFF signal 410-i of interest is turned OFF.

If the case 1 is taken as an example, the diagnosis result 111-i of interest has no failure, and thus the ON/OFF signal 410-i of interest is turned ON. If the case 2 is taken, the diagnosis result 111-i of interest has a minor failure, but the diagnosis results 111-j of the other objects also have a minor failure, and thus the ON/OFF signal 410-i of interest is turned ON. If the case 3 is taken, the diagnosis results 111-j of the other objects have no failure, but the diagnosis result 111-i of interest has a minor failure, thus the ON/OFF signal 410-i of interest being turned OFF. If the case 4 is taken, both the diagnosis result 111-i of interest and the diagnosis results 111-j of the other objects have middle failures, and thus the ON/OFF signal 410-i of interest is turned ON. If the case 5 is taken, the diagnosis results 111-j of the other objects have middle failure, but the diagnosis result 111-i of interest has a serious failure, thus the ON/OFF signal 410-i of interest being turned OFF.

In addition, it is also possible to add the judgment that, when the diagnosis result 111-i of interest has a failure more serious than a certain degree, the ON/OFF signal 410-i of interest is turned OFF irrespective of what degree the diagnosis results of the other objects show. If the case 6 is taken, the diagnosis result 111-i of interest shows a serious failure, and thus the ON/OFF signal 410-i of interest is turned OFF independently of the diagnosis results 111-j of the other objects.

FIG. 32 shows an example of the definition of failure grades. The grades of failure can be classified according to the scale of the function lost due to the failure or to the probability of the occurrence of failure indicated by the diagnosis result. In the embodiments of the invention, since the failure of sensor is not detected by diagnosis until it becomes obvious, the degrees of failure in the sensor are classified according to the scale of the function lost due to the failure of the sensor in the former case. Since the memory can be recovered from failure by the error correction code (ECC), the degrees of failure in the memory can be classified according to the possibility of recovery, or to the probability of the occurrence of failure indicated by the diagnosis result in the latter case. The degrees of failure in the processor can be classified as minor or middle according to the probability of failure occurrence indicated by the diagnosis result, and as serious when the processor function is seriously damaged.

Figure 33:
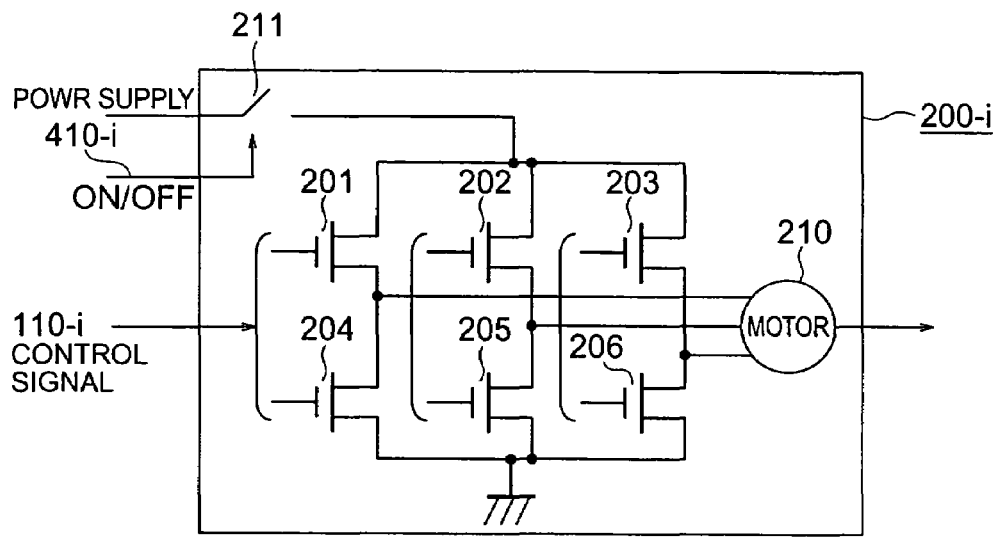
FIG. 33 is a block diagram showing an example of the actuator.

FIGS. 33 through 36 are block diagrams showing embodiments of the invention in which the operation of actuator 200-$i$ is controlled by using ON/OFF signal 410-$i$. FIG. 33 shows an embodiment in which the ON/OFF signal 410-$i$ controls a main switch 211 for the power supply to the actuator 200-$i$ that drives a motor 210 by use of an inverter formed of semiconductor devices 201 to 206. When the ON/OFF signal 410-$i$ is ON, the main switch 211 is closed, and the inverter formed of semiconductor devices 201 to 206 in the actuator 200-$i$ is actuated according to the control signal 110-$i$ to drive the motor 210. When the ON/OFF signal 410-$i$ is OFF, the main switch 211 is opened, and the inverter of semiconductor devices 201 to 206 is stopped from producing the output, thus ceasing to drive the motor 20.

Figure 34:
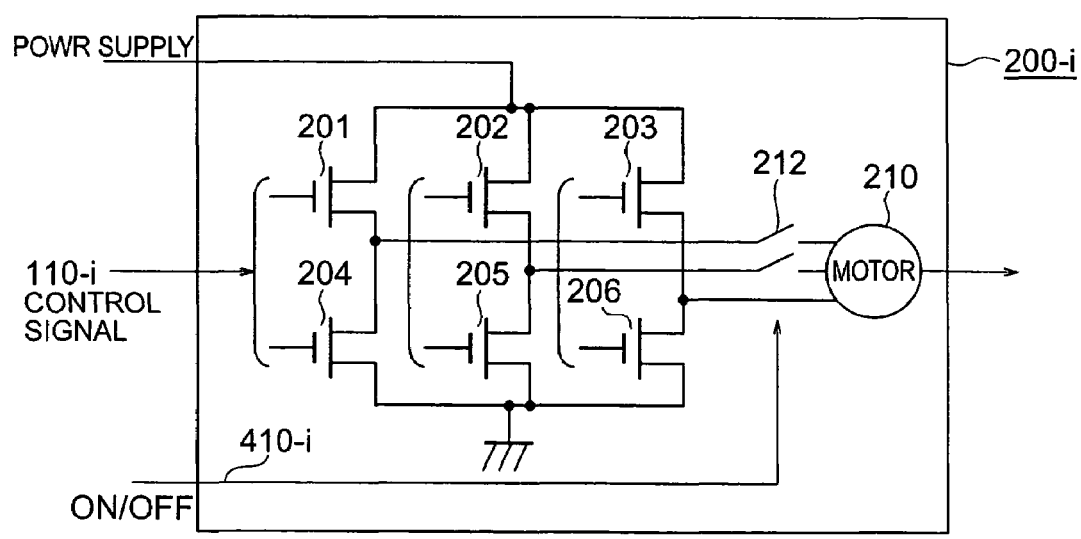
FIG. 34 is a block diagram showing another example of the actuator.

FIG. 34 shows an embodiment in which a switch 212 is opened or closed by the ON/OFF signal 410-$i$ to allow the inverter to supply or not to supply the output to the motor 210. When the ON/OFF signal 410-$i$ is ON, the switch 212 is closed, and the inverter of semiconductor devices 201 to 206 in the actuator 200-$i$ is actuated by the control signal 110-$i$ to drive the motor 210. When the ON/OFF signal 410-$i$ is OFF, the switch 212 is opened, and the inverter of semiconductor devices 201 to 206 is stopped from producing the output, thus ceasing to drive the motor 210.

Figure 35:
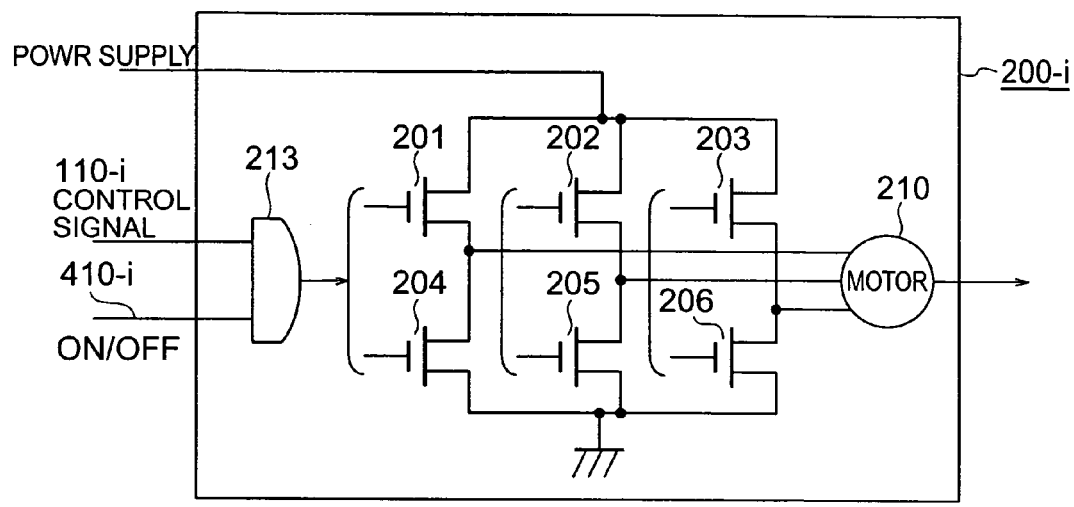
FIG. 35 is a block diagram showing another example of the actuator.

FIG. 35 shows an embodiment in which a logical product (AND) 213 is used to control the gate signals to the semiconductor devices 201 to 206 on the basis of the ON/OFF signal 410-$i$. When the ON/OFF signal 410-$i$ is ON, the inverter of semiconductor devices 201 to 206 is actuated by the control signal 110-$i$ to drive the motor 210. When the ON/OFF signal 410-$i$ is OFF, the gate signals to the semiconductors 201 to 206 are always OFF, and thus the inverter is stopped from producing the output, thus ceasing to drive the motor 210.

Figure 36:
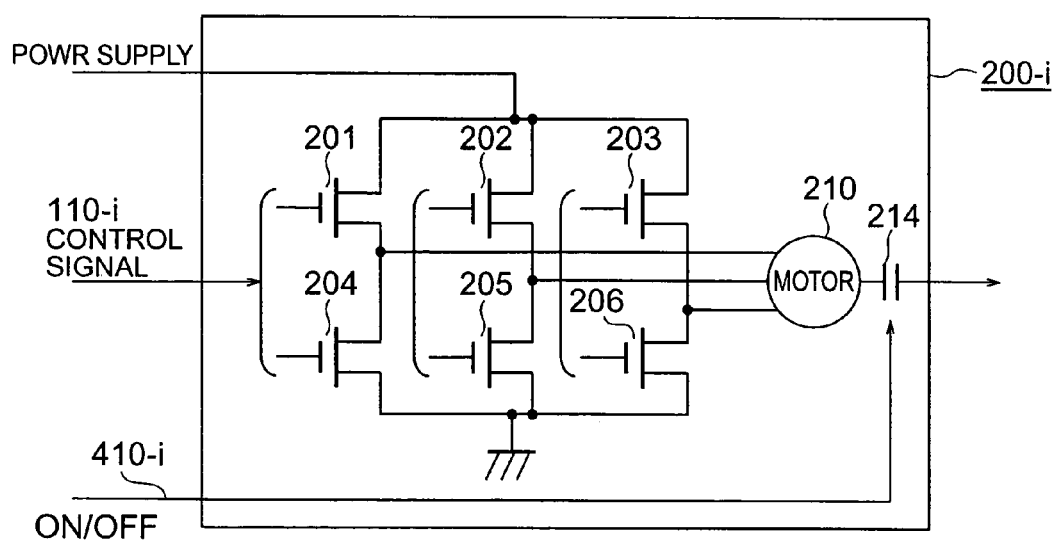
FIG. 36 is a block diagram showing still another example of the actuator.

FIG. 36 shows an embodiment in which a clutch 214 is provided on the output shaft of motor 210 and intermitted according to the ON/OFF signal 410-$i$. When the ON/OFF signal 410-$i$ is ON, the clutch 214 is fastened, and thus the power of the motor 210 is, when the motor is driven, transmitted through its output shaft to the outside. When the ON/OFF signal 410-$i$ is OFF, the clutch 214 is opened, and thus the output power of the motor 210 is not transmitted through the output shaft.

According to the above embodiments of the invention, it is possible to assure the reliability and safety of the high reliability control system, particularly of the steer-by-wire system, x-by-wire system, and the power steering system for large-size cars.

Figure 37:
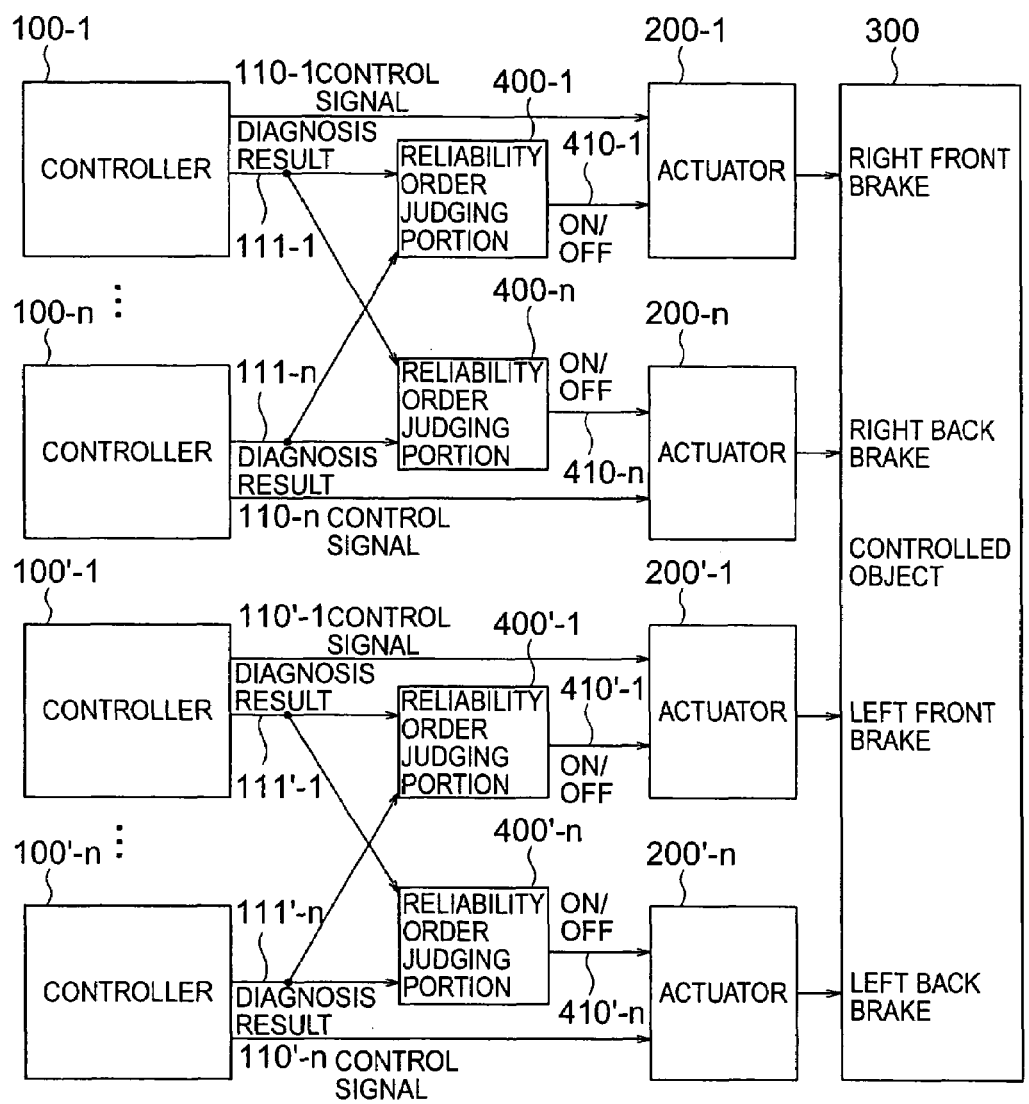
FIG. 37 is a block diagram showing an embodiment of the invention in which this invention is applied to brakes.

FIG. 37 shows an embodiment in which this invention is applied to brakes. The right front brake and right back brake of the controlled object (automobile) 300 are controlled by a doubled control apparatus formed of a set of controllers 100-1, 100-2, actuators 200-1, 200-2, and reliability order judging portions 400-1, 400-2. The left front brake and left back brake of the controlled object (automobile) 300 are controlled by another doubled control apparatus formed of a set of controllers 100-3, 100-4, actuators 200-3, 200-4, and reliability order judging portions 400-3, 400-4. According to this embodiment, if a serious failure occurs in any one of the controller 100-1, actuator 200-1 and reliability order judging portion 400-1 to disable the right front brake, the right back brake is continuously controlled by the controller 100-2, actuator 200-2 and reliability order judging portion 400-2 even if a minor failure occurs in any one of the devices 100-2, 200-2 and 400-2 so that the right brakes of the controlled object (automobile) 300 can be maintained to operate, exerting a certain braking force without causing yaw moment. The same action is taken even if a serious failure occurs in the controller 100-2~100-4, actuator 200-1~200-4, or reliability order judging portion 400-1~400-4.

Figure 38:
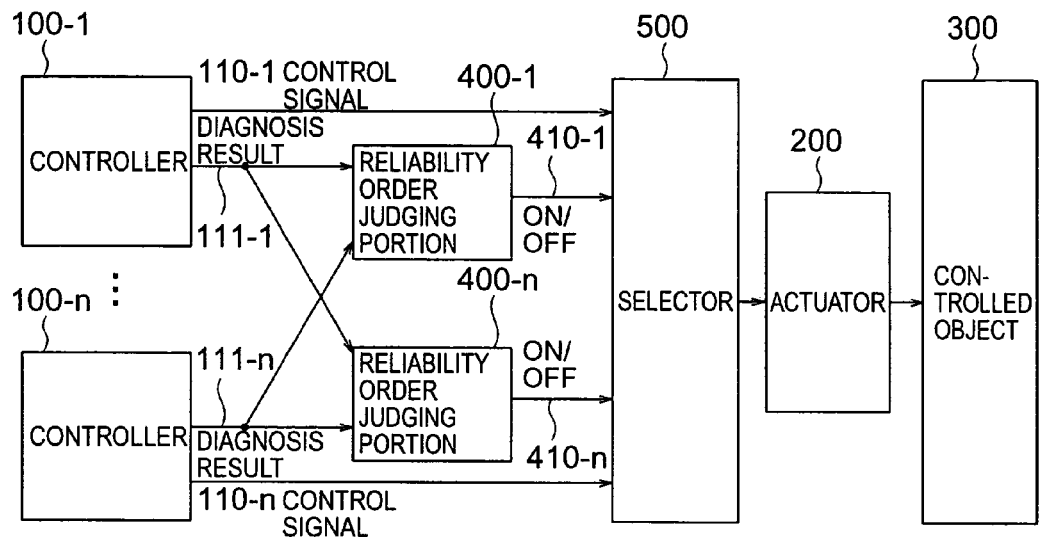
FIG. 38 is a block diagram showing an embodiment of the invention in which a selector is provided.
Figure 39:
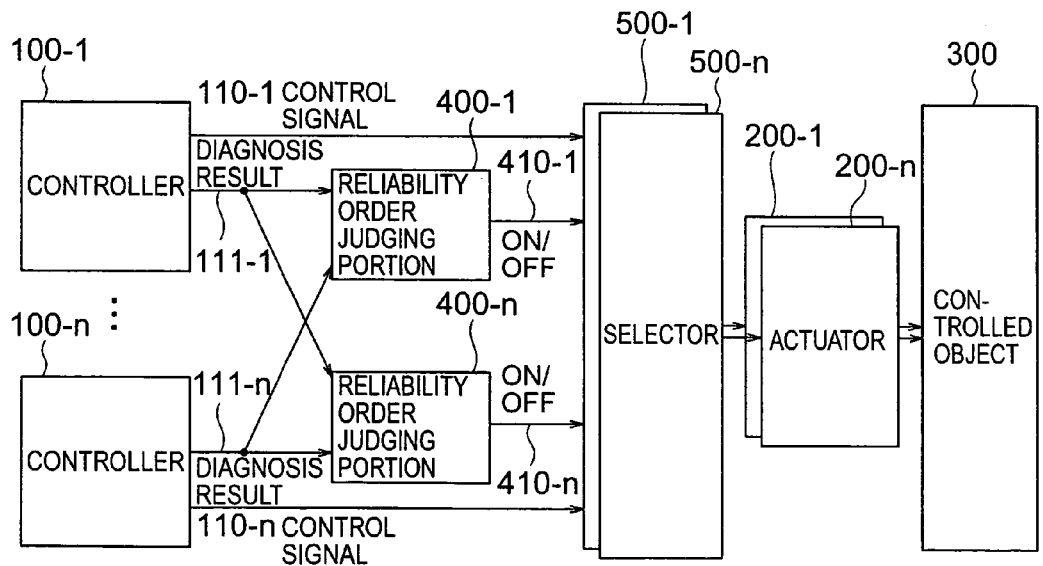
FIG. 39 is a block diagram showing an embodiment of the invention in which selectors and actuators are redundantly provided.

FIG. 38 shows an embodiment in which the control signals 110-1, 110-2 are switched by a selector 500 and supplied to a single actuator 200. The selector 500 may be Modified Votor (MV) described in Patent 2085879 that the inventor already filed. In addition, selectors 500-1~500-$n$, and actuators 200-1~200-$n$ can be redundantly provided as illustrated in FIG. 39.

Thus, according to one embodiment of the invention, it is possible to provide a resolver/digital converter capable of detecting failures by simple computation.

In addition, according to another embodiment of the invention, it is possible to provide a resolver/digital converter that is not immediately affected by the inter-phase short circuit, and that can immediately detect the short circuit.

Moreover, according to still another embodiment of the invention, it is possible to provide a fault tolerance system capable of continuously operating as the whole system even if a failure occurs in both subsystems.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A control apparatus having at least two subsystems, each of said subsystems comprising:
controllers that produce control signals and diagnosis results;
reliability order judging portions that produce ON/OFF signals based on said diagnosis results; and
actuators that affect a controlled object based on said control signals and said ON/OFF signals; wherein
said diagnosis results include an indication of a minor or serious failure of said controllers;
said reliability order judging portions produce ON/OFF signals for making operation of said actuators effective when said failure of said controllers of a subsystem of interest is minor as compared with that of another subsystem; and
said reliability order judging portions produce ON/OFF signals for making operation of said actuators ineffective when the failure of the controllers of the subsystem of interest is serious as compared with that of said another subsystem.

2. A control apparatus according to claim 1, wherein said ON/OFF signals are turned OFF independently when said failure of said controllers of the subsystem of interest is serious, compared with a predetermined failure.

3. A control apparatus according to claim 1, wherein grades of said failure of said controllers of the subsystem of interest are classified by a scale of a function lost.

4. A control apparatus according to claim 1, wherein grades of said failure of said controllers of the subsystem of interest are classified by a probability of an occurrence of the failure.

5. A control apparatus according to claim 3, wherein the failure of the controllers of the subsystem is a failure of a sensor.

6. A control apparatus according to claim 4, wherein the failure of the controllers of the subsystem is a failure of a memory.

7. A control apparatus according to claim 4, wherein the failure of the controllers of the subsystem is a failure of a processor.

8. A control apparatus according to claim 1, wherein a main switch for a power supply to the actuator is controlled on the basis of the ON/OFF signal.

9. A control apparatus according to claim 1, wherein a switch for an output to a motor included in the actuator is controlled on the basis of the ON/OFF signal.

10. A control apparatus according to claim 1, wherein a logical product is used to control gate signals to semiconductor devices included in the actuator on the basis of the ON/OFF signal.

11. A control apparatus according to claim 1, wherein a clutch provided on an output shaft of a motor included in the actuator is controlled on the basis of the ON/OFF signal.

12. A vehicle motion control apparatus in which a control apparatus according to claim 1 is used, and first and second controllers are provided according to said control apparatus, said first controller being used to control the right front and right back brakes of a vehicle, said second controller being used to control the left front and left back brakes of said vehicle.

* * * * *